United States Patent
Choi et al.

(10) Patent No.: US 11,521,672 B2
(45) Date of Patent: Dec. 6, 2022

(54) SEMICONDUCTOR DEVICE AND MEMORY SYSTEM

(71) Applicant: Samsung Electronics Co., Ltd., Suwon-si (KR)

(72) Inventors: Hyeokjun Choi, Suwon-si (KR); Jindo Byun, Suwon-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/230,519

(22) Filed: Apr. 14, 2021

(65) Prior Publication Data
US 2022/0059155 A1   Feb. 24, 2022

(30) Foreign Application Priority Data
Aug. 21, 2020   (KR) .................. 10-2020-0105421

(51) Int. Cl.
| | | |
|---|---|---|
| *G11C 7/22* | (2006.01) | |
| *G11C 11/4091* | (2006.01) | |
| *G11C 11/406* | (2006.01) | |
| *G11C 11/4076* | (2006.01) | |
| *G11C 11/408* | (2006.01) | |
| *G11C 11/4096* | (2006.01) | |

(52) U.S. Cl.
CPC ........ *G11C 11/4091* (2013.01); *G11C 11/406* (2013.01); *G11C 11/4076* (2013.01); *G11C 11/4085* (2013.01); *G11C 11/4096* (2013.01)

(58) Field of Classification Search
CPC .................................................. G11C 11/4091
See application file for complete search history.

(56) References Cited

U.S. PATENT DOCUMENTS

| | | | |
|---|---|---|---|
| 5,265,102 A | 11/1993 | Saito | |
| 6,169,504 B1 * | 1/2001 | Park ................... | H03M 1/1215 341/158 |
| 7,099,400 B2 | 8/2006 | Yang et al. | |
| 7,126,408 B2 | 10/2006 | Zerbe | |
| 9,742,594 B2 | 8/2017 | Dallaire et al. | |
| 10,103,911 B2 | 10/2018 | Shibasaki | |
| 10,425,219 B2 | 9/2019 | Lim | |
| 10,522,204 B1 | 12/2019 | Yu et al. | |

(Continued)

OTHER PUBLICATIONS

Extended European Search Report dated Dec. 17, 2021 issued in corresponding European Appln. No. 21183978.2.

*Primary Examiner* — Min Huang
(74) *Attorney, Agent, or Firm* — Harness, Dickey & Pierce, P.L.C.

(57) ABSTRACT

A semiconductor device includes: a multi-level receiver including N sense amplifiers and a decoder decoding an output of the N sense amplifiers, each of the N sense amplifiers receiving a multi-level signal having M levels and a reference signal (where M is a natural number, higher than 2, and where N is a natural number, lower than M); a clock buffer receiving a reference clock signal; and a clock controller generating N clock signals using the reference clock signal, inputting the N clock signals to the N sense amplifiers, respectively, and individually determining a phase of each of the N clock signals using the output of the N sense amplifiers.

19 Claims, 24 Drawing Sheets

(56) References Cited

U.S. PATENT DOCUMENTS

| | | | |
|---|---|---|---|
| 10,712,770 B1* | 7/2020 | Chiang | G06F 1/10 |
| 2004/0155806 A1* | 8/2004 | Lee | H03M 1/0624 |
| | | | 341/155 |
| 2011/0085387 A1 | 4/2011 | Lee | |
| 2014/0016404 A1 | 1/2014 | Kim et al. | |
| 2015/0066819 A1 | 3/2015 | Mozak et al. | |
| 2017/0279592 A1 | 9/2017 | Hammad et al. | |
| 2018/0278461 A1* | 9/2018 | Hollis | G11C 11/5642 |
| 2019/0312756 A1 | 10/2019 | Musah et al. | |

\* cited by examiner

SEMICONDUCTOR DEVICE AND MEMORY SYSTEM

CROSS-REFERENCE TO RELATED APPLICATION(S)

This application claims benefit of priority to Korean Patent Application No. 10-2020-0105421 filed on Aug. 21, 2020 in the Korean Intellectual Property Office, the disclosure of which is incorporated herein by reference in its entirety.

BACKGROUND

1. Field

The present inventive concepts relate to a semiconductor device and a memory system.

2. Description of Related Art

A memory device may provide a function of writing and erasing data in response to a control signal received from an external controller, or reading the recorded data. The memory device may receive data from the controller, and store it in memory cells, and can transmit data as a non-return-zero (NRZ) signal and other multilevel signals to improve a data transmission speed between the memory device and the controller.

SUMMARY

An aspect of the present inventive concepts is to provide a semiconductor device capable of accurately restoring information transmitted by a controller to a multi-level signal, by individually adjusting a phase of each of clock signals input to sense amplifiers receiving the multi-level signal and a memory system.

According to an aspect of the present inventive concepts, a semiconductor device includes: a multi-level receiver including N sense amplifiers and a decoder decoding an output of the N sense amplifiers, each of the N sense amplifiers receiving a multi-level signal having M levels and a reference signal (where M is natural number, higher than 2, and where N is a natural number, lower than M); a clock buffer configured to receive a reference clock signal; and a clock controller configured to generate N clock signals using the reference clock signal, input the N clock signals to the N sense amplifiers, respectively, and individually determine a phase of each of the N clock signals using the output of the N sense amplifiers.

According to an aspect of the present inventive concepts, a semiconductor device includes: a memory cell array including a plurality of memory cells connected to a plurality of word lines and a plurality of bit lines; a word line driver connected to the word lines; a read/write circuit connected to the bit lines; a multi-level receiver including a plurality of sense amplifiers receiving a multi-level signal having M levels (where M is a natural number, higher than 2) from an external controller, and a decoder decoding an output of the sense amplifiers, a clock controller configured to generate a plurality of clock signals and input the clock signals to the plurality of sense amplifiers, respectively, and individually adjust a phase of each of the clock signals using the output of the sense amplifiers, when the multi-level receiver receives a test data pattern from the external controller during a refresh operation on the memory cells.

According to an aspect of the present inventive concepts, a memory system includes: a memory device having a plurality of memory cells; and a controller connected to the memory device through a plurality of pins, and configured to control the memory device, wherein the controller transmits at least one of a data signal, a data strobe signal, and a command/address signal through the plurality of pins to the memory device, the controller transmits a refresh command to the memory device, and while the memory device performs a refresh operation in response to the refresh command, the controller transmits a test data pattern to the memory device as a multi-level signal through at least one of the plurality of pins.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concepts will be described with reference to the accompanying drawings.

Figure 1:
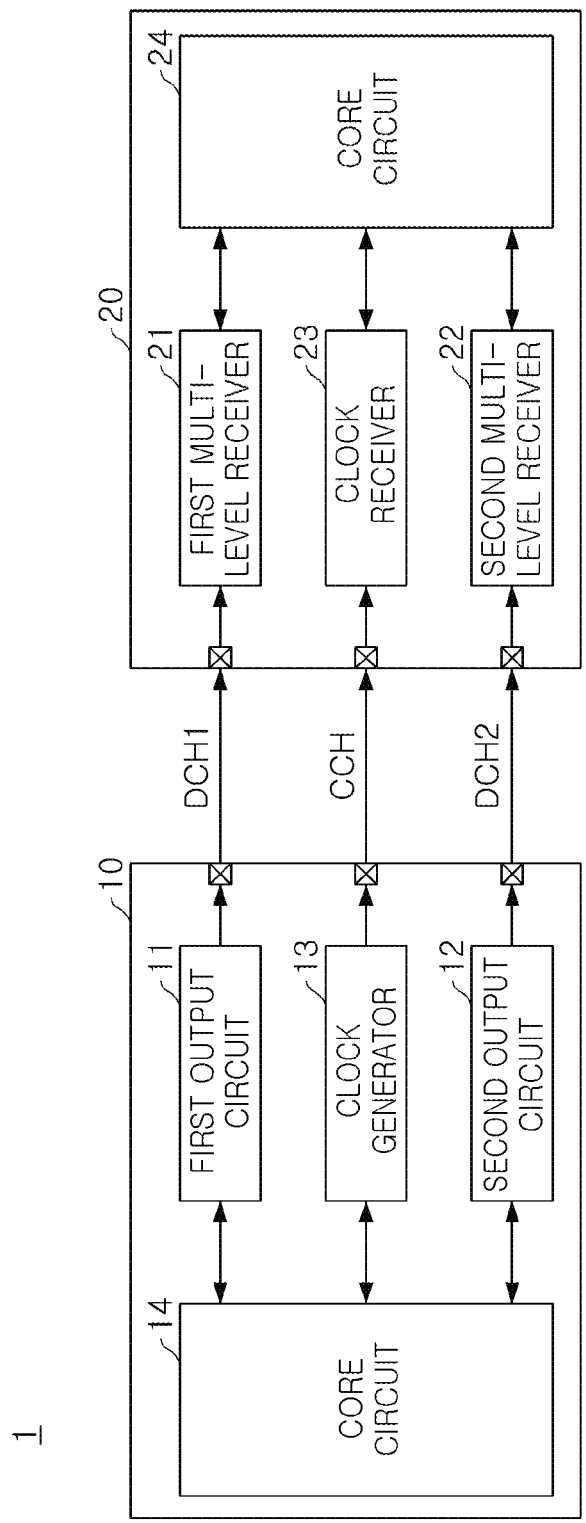
FIG. 1 is a schematic view of a system including a semiconductor device according to example embodiments of the present inventive concepts.

FIG. 1 is a schematic view of a system including a semiconductor device according to example embodiments of the present inventive concepts.

Referring to FIG. 1, a system 1 according to example embodiments of the present inventive concepts may include a first semiconductor device 10 and a second semiconductor device 20 transmitting and receiving data. In the system 1 according to example embodiments illustrated in FIG. 1, the first semiconductor device 10 may transmit data to the second semiconductor device 20.

For example, the first semiconductor device 10 may transmit a data signal and a clock signal to the second semiconductor device 20. The first semiconductor device 10 may include a first output circuit 11 and a second output circuit 12 for transmitting a data signal, a clock generator 13 for transmitting a clock signal, a core circuit 14 controlling an overall operation of the first semiconductor device 10, and/or the like.

The second semiconductor device 20 may include a first multi-level receiver 21 and a second multi-level receiver 22 receiving a data signal, a clock receiver 23 receiving a clock signal, a core circuit 24 controlling an overall operation of the second semiconductor device 20, and/or the like.

Each of the first and second output circuits 11 and 12 may transmit a data signal as a multi-level signal. Accordingly, each of data signals transmitted through a first data channel DCH1 and a second data channel DCH2 may be a multi-level signal having M levels, and M may be a natural number greater than 2. For example, M may be a power of 2, and may be determined according to an amount of data to be transmitted through each of the data channels DCH1 and DCH2.

The clock generator 13 may transmit a reference clock signal to the second semiconductor device 20 through a clock channel CCH. The reference clock signal may be a signal repeating an increase and a decrease between two levels. However, according to example embodiments, the reference clock signal may also be generated as a multi-level signal, similar to the data signal and transmitted to the second semiconductor device 20. In an example embodiment, the number of levels that the reference clock signal can have and the number of levels that the data signal can have may be the same or different from each other.

The first multi-level receiver 21 and the second multi-level receiver 22 may be restored by receiving a data signal. For example, the first multi-level receiver 21 may include N sense amplifiers receiving a multi-level signal having M levels and a reference signal. N may be a natural number, smaller than M defining the multi-level signal, and a decoder for decoding an output of the N sense amplifiers may be further included in the first multi-level receiver 21. The configuration and operation of the second multi-level receiver 22 may be similar to that of the first multi-level receiver 21.

Each of the N sense amplifiers included in the first multi-level receiver 21 may compare a data signal received through a first data channel DCH1 with a reference signal and output the result thereof to a decoder. In an example embodiment, an operation timing of each of the sense amplifiers may be determined according to a clock signal transmitted from a clock receiver 23 to the first multi-level receiver 21. For example, each of the senses amplifiers may compare the data signal and the reference signal at a rising edge and a falling edge of the clock signal and output the result thereof to the decoder. Accordingly, when a phase of the clock signal is not properly controlled, an error may occur in the outputs of the sense amplifiers and/or data restored by the first multi-level receiver 21.

The data signal and/or the clock signal input to each of the sense amplifiers included in the first multi-level receiver 21 and the second multi-level receiver 22 may have different timings due to differences in characteristics of parasitic capacitance and resistance components, present in a routing wiring, and/or elements included in the sense amplifiers. In example embodiments of the present inventive concepts, by individually controlling the phase of a clock signal input to each of the sense amplifiers, timing differences due to parasitic capacitance, resistance components, and characteristics of elements may be compensated, and the performance of the multi-level receivers 21 and 22 can be improved.

Figure 2:
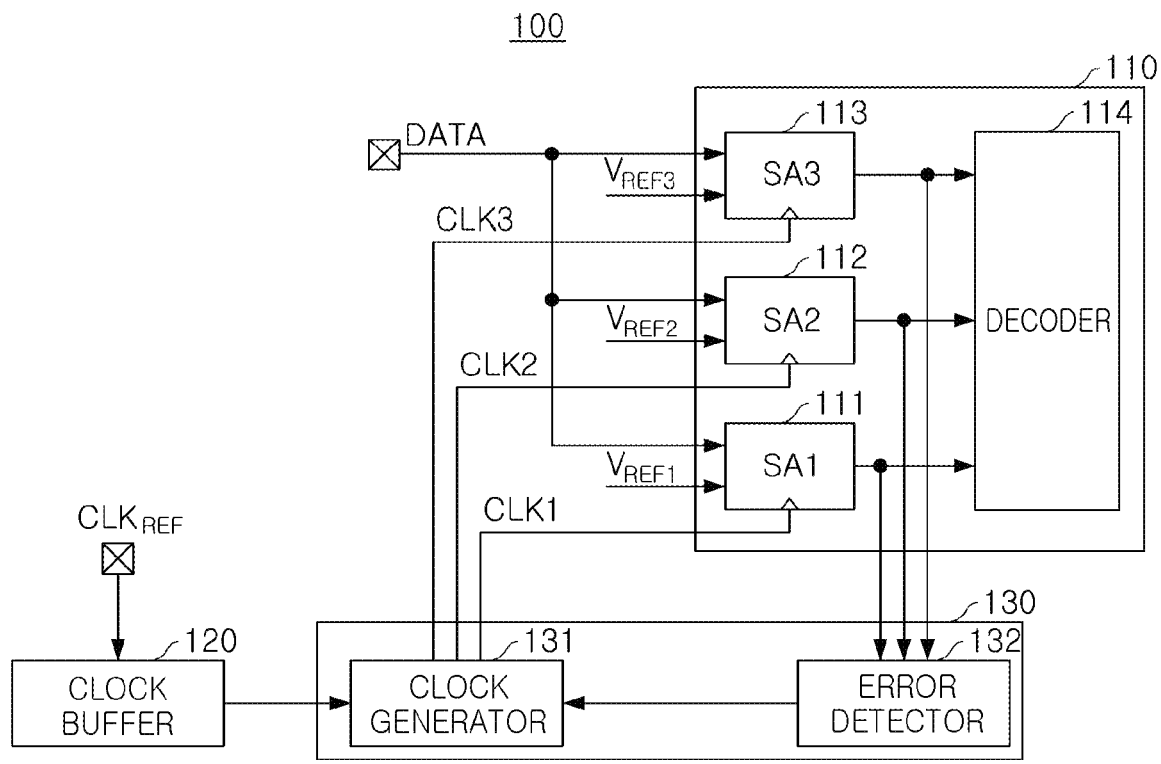
FIG. 2 is a view schematically illustrating a semiconductor device according to example embodiments of the present inventive concepts.

FIG. 2 is a view schematically illustrating a semiconductor device according to example embodiments of the present inventive concepts.

Referring to FIG. 2, a semiconductor device 100 according to example embodiments of the present inventive concepts may include a multi-level receiver 110, a clock buffer 120, a clock controller 130, and/or the like. The multi-level receiver 110 may include a plurality of sense amplifiers 111 to 113 receiving a data signal transmitted to a multi-level signal, and a decoder 114 decoding an output of the sense amplifiers 111 to 113. In example embodiments, the data signal may be a multi-level signal having M levels (where M is a natural number, higher than 2), and the number of sense amplifiers 111 to 113 may be N (where N is a natural number, smaller than M). For example, according to a transmission speed of the data signal, M may be defined as a power of M, and N may be defined as M−1. The clock buffer 120 may receive a reference clock signal (CLK$_{REF}$). The clock controller 130 may generate clock signals CLK1 to CLK3 using the reference clock signal (CLK$_{REF}$). The N clock signals CLK1 to CLK3 may be input to the N sense amplifiers 111 to 113, respectively.

The first sense amplifier 111 may operate according to the first clock signal CLK1 and compare the data signal with a first reference signal V$_{REF1}$, and the second sense amplifier 112 may operate according to the second clock signal CLK2 and compare the data signal with a second reference signal V$_{REF2}$. The third sense amplifier 113 may operate according to the third clock signal CLK3 and compare the data signal with a third reference signal V$_{REF3}$.

The data signal input to the sense amplifiers 111 to 113 may have different phases due to a difference in length of a path along which the data signal DATA is transmitted, and a difference in resistance with parasitic capacitance may accordingly occur.

Since the clock signals CLK1 to CLK3 are input to the sense amplifiers 111 to 113, respectively, when the phases of the clock signals CLK1 to CLK3 are adjusted together, the data signal may not be accurately restored in at least one of the sense amplifiers 111 to 113.

In example embodiments of the present inventive concepts, the clock controller 130 may individually control the phase of each of the clock controls CLK1 to CLK3 by using the outputs of each of the sense amplifiers 111 to 113.

The clock controller 130 may include a clock generator 131 determining a phase of each of the clock signals CLK1 to CLK3, an error detector 132 detecting an output of each of the sense amplifiers 111 to 113, and/or the like.

The clock generator 131 may include a plurality of delay cells determining a delay time of each of the clock signals CLK1 to CLK3 so that the phase of each of the clock signals CLK1 to CLK3 can be individually controlled.

According to example embodiments, the clock controller 130 may adjust the phases of each of the clock signals CLK1 to CLK3 simultaneously or sequentially.

Figure 3:
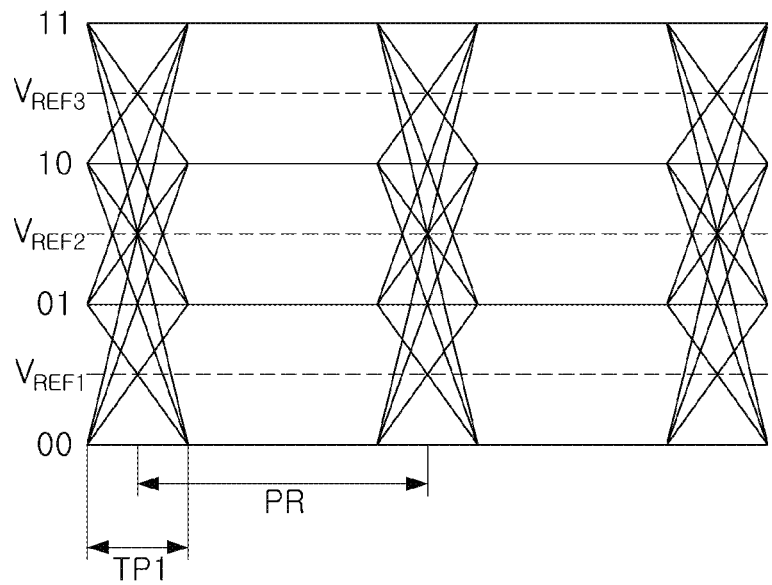
FIGS. 3 to 5 are views illustrating a multi-level signal received by a semiconductor device according to example embodiments of the present inventive concepts.
Figure 4:
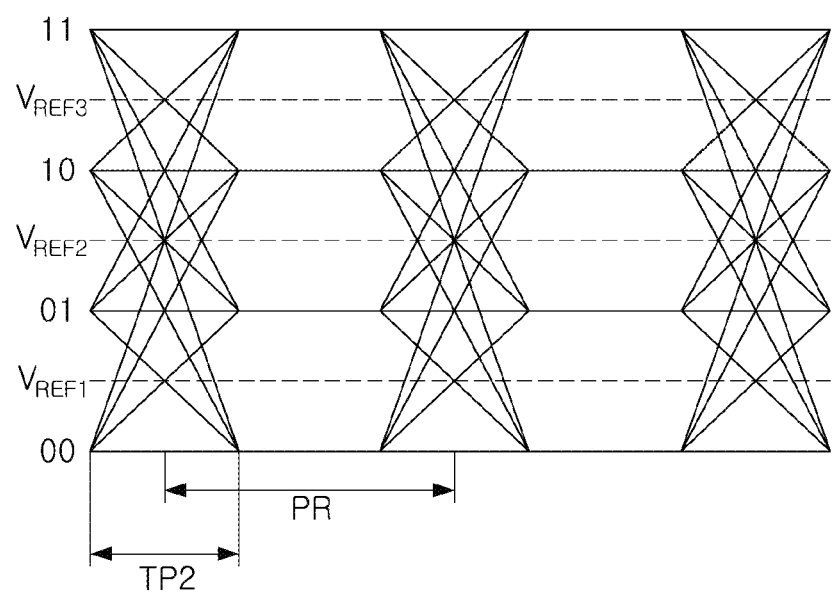
Figure 5:
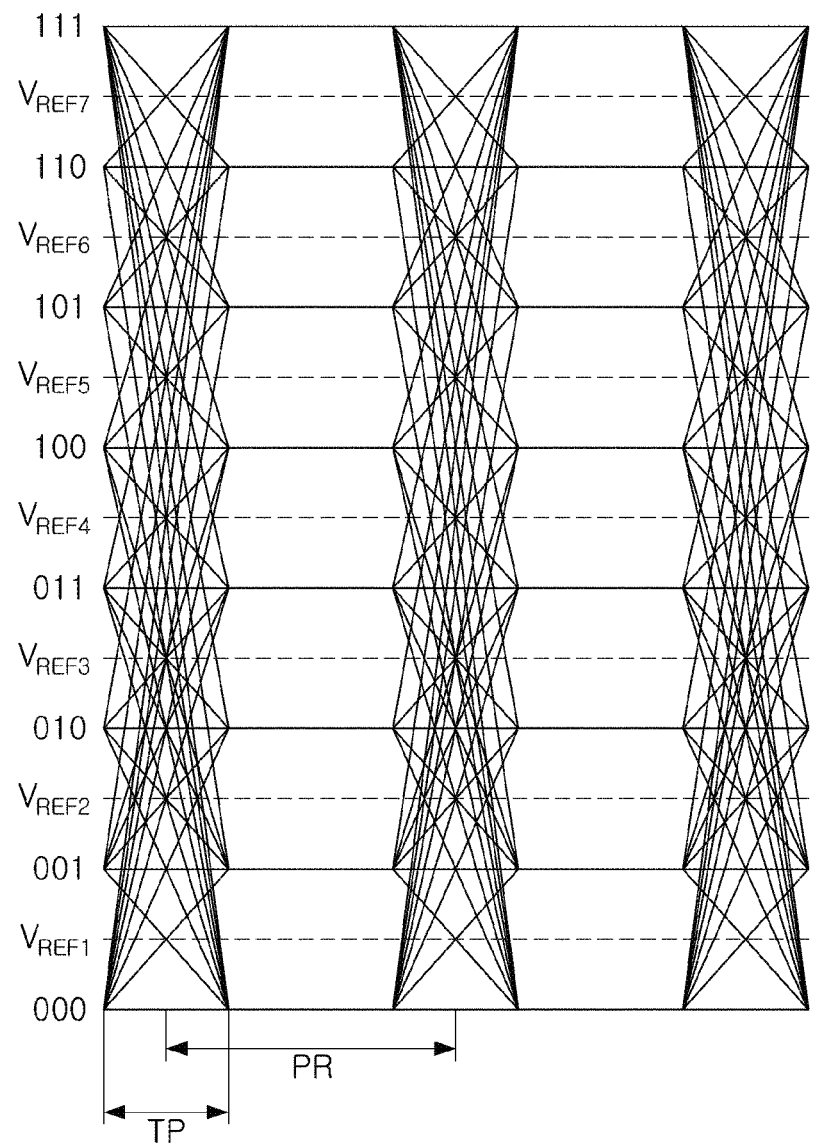

FIGS. 3 to 5 are views illustrating a multi-level signal received by a semiconductor device according to example embodiments of the present inventive concepts.

First, referring to FIGS. 3 and 4, a multi-level signal received by a semiconductor device in example embodiments of the present inventive concepts may have four levels LV1 to LV4. In example embodiments illustrated in FIGS. 3 and 4, the semiconductor device may generate a multi-level signal based on 4-level pulse amplitude modulation-4 (PAM-4). By the multi-level signal generated based on 4-level pulse width modulation, two data bits can be received during one data transmission period (PR).

For example, each of the four levels LV1 to LV4 may correspond to data of 00, 01, 10, and 11. Accordingly, the semiconductor device may receive two bits, for example, one of 00, 10, 01, and 11 during one data transmission period PR. The semiconductor device may include a multi-level receiver receiving a multi-level signal and restoring data, and the multi-level receiver may include a plurality of sense amplifiers.

For example, when a multi-level signal is generated based on 4-level pulse amplitude modulation as shown in FIGS. 3 and 4, the multi-level receiver may include three sense amplifiers. When n bits of data are received during one data transmission period PR by a multi-level signal, the multi-level signal may have $2^n$ levels, and the multi-level receiver may include operation ($2^n-1$) sense amplifiers.

The sense amplifiers may compare the multi-level signal with reference signals $V_{REF1}$ to $V_{REF3}$. For example, the first sense amplifier may compare the multi-level signal with a first reference signal. For example, the first sense amplifier compares the multi-level signal with the first reference signal $V_{REF1}$, and if the multi-level signal is less than the first reference signal $V_{REF1}$, it can be judged that the multi-level signal corresponds to a [00] data bit. Similarly, the second sense amplifier may compare the multi-level signal with a second reference signal $V_{REF2}$, and the third sense amplifier may compare the multi-level signal with a third reference signal $V_{REF3}$.

Each of the reference signals $V_{REF1}$ to $V_{REF3}$ may be an intermediate value of at least some of the levels LV1 to LV4 that the multi-level signal may have. For example, the first reference signal $V_{REF1}$ may be an intermediate value between the first level LV1 and the second level LV2, and the second reference signal $V_{REF2}$ may be an intermediate value between the second level LV2 and the third level LV3. The third reference signal $V_{REF3}$ may be an intermediate value between the third level LV3 and the fourth level LV4.

When distortion occurs in the multi-level signal, differences between the first to fourth levels LV1 to LV4 may be different from each other. For example, a difference between the first level LV1 and the second level LV2 may be the smallest, and a difference between the third level LV3 and the fourth level LV4 may be the largest. When distortion occurs in the multilevel signal, the reference signals $V_{REF1}$ to $V_{REF3}$ may be adjusted together in consideration of the distortion of the multi-level signal.

In example embodiments illustrated in FIG. 5, three bits of data may be received during one data transmission period PR by a multi-level signal. Accordingly, a multi-level signal is generated based on 8-level pulse amplitude modulation, and the multi-level signal may have eight different levels LV1 to LV8. The eight different levels LV1 to LV8 may correspond to data of 000, 001, 010, 011, 100, 101, 110, and 111, respectively.

For example, the multi-level signal according to example embodiments illustrated in FIG. 3 may be a signal input to a first sense amplifier, and the multi-level signal according to example embodiments illustrated in FIG. 4 may be a signal input to a second sense amplifier. The first sense amplifier and the second sense amplifier may be included in one multi-level receiver. During transition periods TP1 and TP2, the multi-level signal may increase or decrease between the levels LV1 to LV4. For example, due to a difference between a routing path from a receiving pad receiving the multi-level signal to an input terminal of the first sense amplifier and a routing path from a receiving pad to an input terminal of the second sense amplifier, the multi-level signal input to the first sense amplifier may have a first transition period TP1, and the multi-level signal input to the second sense amplifier may have a second transition period TP2, different from the first transition period TP1.

Therefore, when a clock signal having the same phase is input to the sense amplifiers, an error may occur in an output of the sense amplifiers. Ideally, each of the sense amplifiers can compare the multi-level signal and the reference signals $V_{REF1}$ to $V_{REF3}$ at an intermediate point of the data transmission period PR. When the phases of the clock signals input to the sense amplifiers are the same, an error may occur in the output of at least one of the sense amplifiers due to a difference between the transition periods TP1 and TP2.

In order to solve this problem, in example embodiments of the present inventive concepts, a phase of a clock signal input to each of the sense amplifiers may be individually controlled. For example, in consideration of the difference between the first transition period TP1 of the multi-level signal input to the first sense amplifier and the second transition period TP2 of the multi-level signal input to the second sense amplifier, the first clock signal input to the first sense amplifier and the second clock signal input to the second sense amplifier may have different phases.

Figure 6:
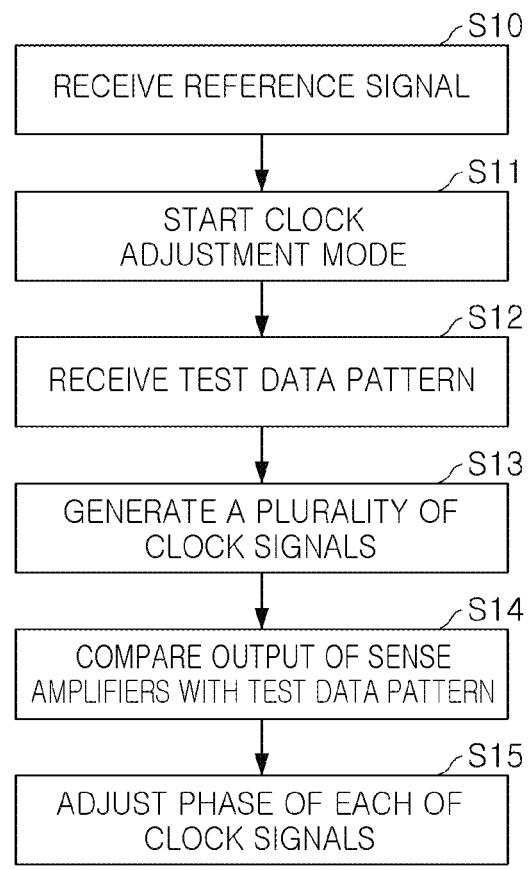
FIGS. 6 and 7 are views provided to illustrate an operation of the semiconductor device according to example embodiments of the present inventive concepts.
Figure 7:
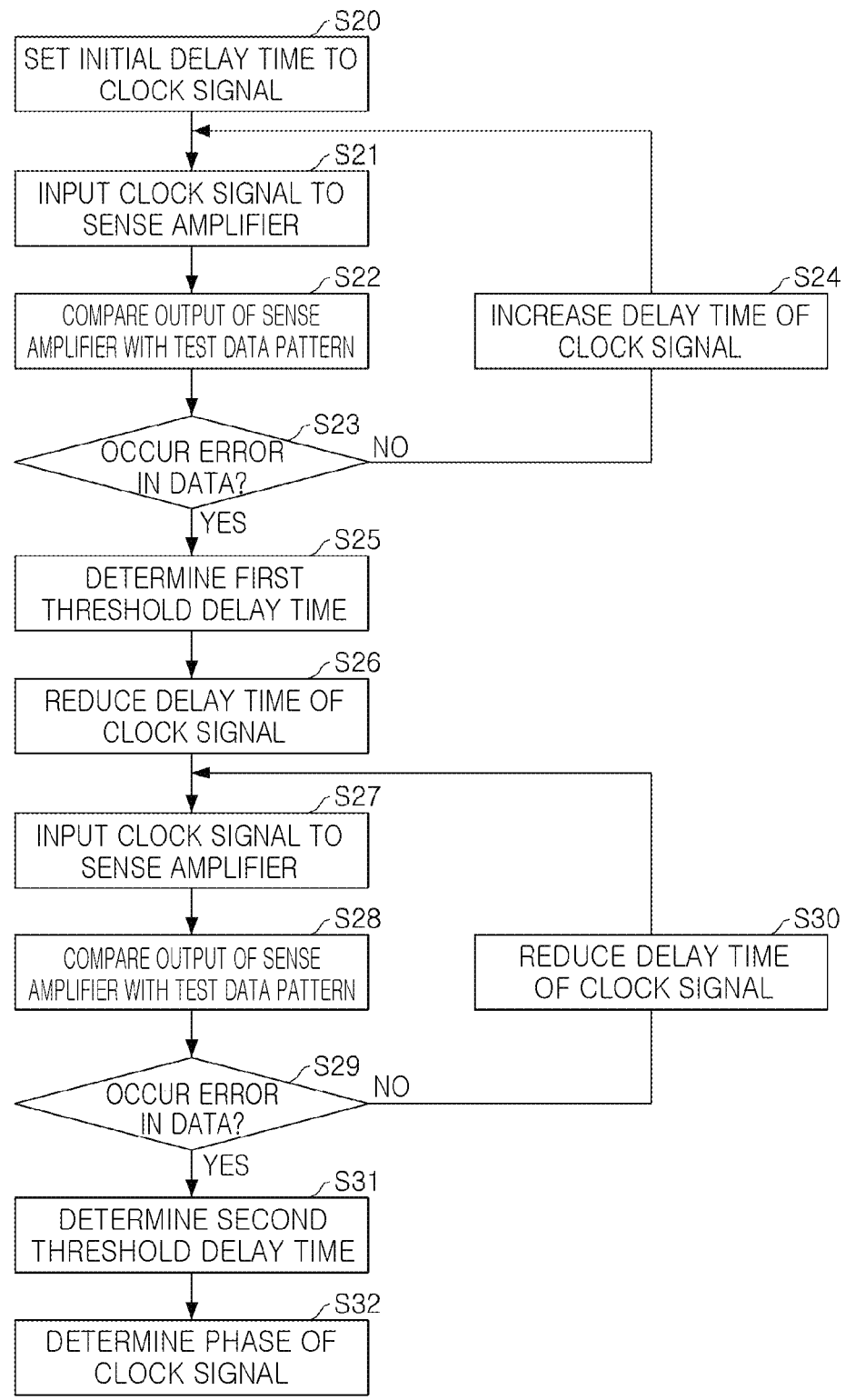

FIGS. 6 and 7 are views provided to describe an operation of the semiconductor device according to example embodiments of the present inventive concepts.

First, referring to FIG. 6, an operation of a semiconductor device according to example embodiments of the present inventive concepts may be stated by receiving a reference clock signal (S10). For example, a reference clock signal may be received from other semiconductor devices that are connected to communicate to each other. After receiving the reference clock signal, a clock adjustment mode may be started (S11). The clock adjustment mode may be an operation mode for individually adjusting a phase of each of the clock signals input to the sense amplifiers receiving a multi-level signal. When the clock adjustment mode starts, a test data pattern may be received from another semiconductor device that has transmitted a reference clock signal (S12). For example, the test data pattern may be a Pseudo Random Binary Sequence (PRBS) pattern.

A clock controller included in the semiconductor device may generate a plurality of clock signals using a reference clock signal (S13). For example, the clock controller may generate a plurality of clock signals by delaying the reference clock signal by a predetermined or alternatively, desired initial delay time. In operation S13, the plurality of clock signals may have the same phase and may be input to sense amplifiers. The clock controller may compare an output of each of the sense amplifiers with a test data pattern (S14). The test data pattern may be data input as a multi-level signal to each of the sense amplifiers. Based on a comparison result of operation S14, the clock controller may determine whether an error exists in an output of each of the sense amplifiers, and individually adjust the phase of each of the clock signals accordingly (S15).

In example embodiments of the present inventive concepts, the output of the sense amplifier may compare with a test data pattern, and if an error is not present, a delay time of the clock signal input to the sense amplifier may be intentionally increased or decreased, and an output of the sense amplifier can be compared with the test data pattern. A threshold delay time of the clock signal may be found by increasing or decreasing the delay time of the clock signal until the output of the sense amplifier does not match the test data pattern, and the delay time of the clock signal, improved or optimized for the sense amplifier may be found using the threshold delay time, and the phase may be adjusted. Hereinafter, it will be described in more detail with reference to FIG. 7.

Referring to FIG. 7, the phase adjustment of a clock signal according to example embodiments of the present inventive concepts may be started with setting an initial delay time to the clock signal (S20). As described above, the initial delay time may be set in common with clock signals input to sense amplifiers included in the multi-level receiver. The clock signal for which the initial delay time is set may be input to the sense amplifier (S21).

The sense amplifier may operate in synchronization with a clock signal, and can compare and output a multi-level signal and a reference signal. The clock controller may compare the output of the sense amplifier with the test data pattern (S22), and determine whether an error has occurred (S23). As described above, the test data pattern may be data input to the sense amplifier as a multi-level signal. Therefore, by comparing the test data pattern with the output of the sense amplifier, it is possible to determine whether the sense amplifier operating in synchronization with the clock signal accurately receives the multi-level signal.

If it is determined that no error has occurred in operation S23, the clock controller may intentionally increase a delay time of the clock signal (S24). It can be understood that the phase of the clock signal is delayed. The clock signal with the increased delay time may be input to the sense amplifier, and the output of the sense amplifier can be compared with the test data pattern again. The delay time of the clock signal may increase until it is determined that an error has occurred in operation S23 since the output of the sense amplifier does not match the test data pattern.

If it is determined that an error has occurred in operation S23, the clock controller may determine a delay time of the clock signal as a first threshold delay time (S25). The clock controller may reduce the delay time of the clock signal (S26). In an example embodiment, the clock controller may reduce the delay time of the clock signal, after resetting the delay time of the clock signal to an initial delay time.

The clock controller may input a clock signal with a reduced delay time to the sense amplifier (S27), compare the output of the sense amplifier with the test data pattern (S28), and determine whether an error has occurred (S29). If it is determined that no error has occurred in operation S29, the clock controller may further reduce the delay time of the clock signal (S30), and input the clock signal to the sense amplifier.

For example, the clock controller may reduce a delay time of the clock signal until it is determined that an error has occurred in operation S29 since the output of the sense amplifier does not match the test data pattern. If it is determined that an error has occurred in operation S29, the clock controller may determine a delay time of the clock signal as a second threshold delay time (S31). The clock controller may determine the phase of the clock signal improved or optimized for the sense amplifier using the first threshold delay time and the second threshold delay time (S32).

A difference between the first threshold delay time and the second threshold delay time may be calculated, and the calculation result may be added to an initial delay time, to determine a final delay time and a phase of the clock signal. For example, if the first threshold delay time is greater than the second threshold delay time, the final delay time of the clock signal may increase further than the initial delay time, and if the first threshold delay time is shorter than the second threshold delay time, the final delay time of the clock signal may be reduced further than the initial delay time.

FIGS. 8 to 13 are views provided to illustrate an operation of a semiconductor device according to example embodiments of the present inventive concepts.

A semiconductor device according to example embodiments may include a multi-level receiver receiving a multi-level signal MLS, and as described above, the multi-level receiver may include a plurality of sense amplifiers commonly receiving the multi-level signal MLS. Each of the sense amplifiers may compare the multi-level signal MLS with a reference signal, in synchronization with the clock signal and in example embodiments of the present inventive concepts, a phase of the clock signal input to each of the sense amplifiers may be individually adjusted, such that it is possible to reduce or prevent malfunction of the multi-level receiver.

Hereinafter, a clock signal adjustment operation of a semiconductor device according to example embodiments of the present inventive concepts will be described with reference to FIGS. 8 to 13.

Figure 8:
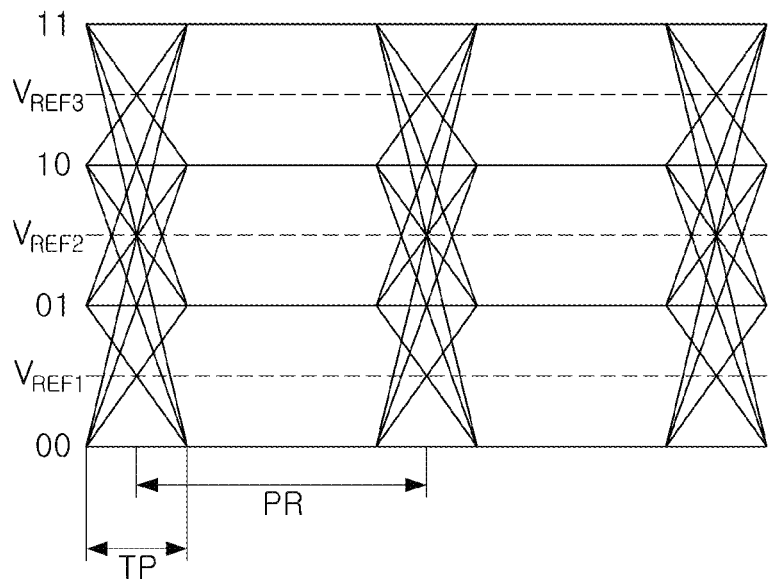
FIGS. 8 to 13 are views provided to illustrate an operation of the semiconductor device according to example embodiments of the present inventive concepts.
Figure 8:
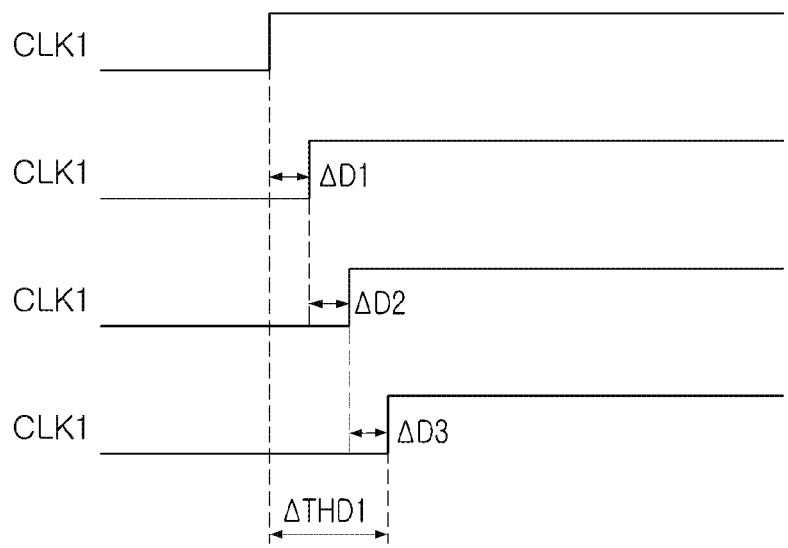

First, referring to FIG. 8, the multi-level signal MLS may have one of the first to fourth levels LV1 to LV4, and may transmit 2 bits of data during one data transmission period PR. The multi-level signal MLS may be input to a first sense amplifier operating in synchronization with a first clock signal CLK1, and the first clock signal CLK1 may be set to have an initial delay time.

The multi-level signal MLS may be a signal for transmitting a test data pattern to the semiconductor device while adjusting the phase of the first clock signal CLK1.

When the first sense amplifier operates in synchronization with the first clock signal CLK1 and compares the multi-level signal MLS with one of reference signals $V_{REF1}$-$V_{REF3}$, the clock controller may compare an output of the first sense amplifier with a test data pattern. While the first sense amplifier operates by the first clock signal CLK1 for which the initial delay time is set, the output of the first sense amplifier may match the test data pattern.

The clock controller may increase a delay time of the first clock signal CLK by a first delay amount $\Delta D1$ and input it to the first sense amplifier.

In example embodiments illustrated in FIG. 8, even when the delay time increases by the first delay amount $\Delta D1$, the output of the first sense amplifier may match the test data pattern. The clock controller may further delay the delay time of the first clock signal CLK1 by a second delay amount $\Delta D2$ and input it to the first sense amplifier. Even when the second delay amount $\Delta D2$ is added, a rising edge and a falling edge of the first clock signal CLK1 may not overlap the first transition period of the multi-level signal. Therefore, the output of the first sense amplifier may match the test data pattern.

When the clock controller further delays the delay time of the first clock signal CLK1 by a third delay amount $\Delta D3$, the rising edge and the falling edge of the first clock signal CLK1 may overlap the first transition period of the multi-level signal MLS. Therefore, the output of the first sense amplifier may not match the test data pattern.

The clock controller may set the delay time of the first clock signal CLK1 as a first threshold delay time ΔTHD1 when the output of the first sense amplifier does not match the test data pattern. For example, the first threshold delay time ΔTHD1 may be determined as a sum of the first to third delay amounts ΔD1 to ΔD3. According to example embodiments, the first to third delay amounts ΔD1 to ΔD3 for finding the first threshold delay time ΔTHD1 may be different from each other, or at least a portion thereof may be the same.

When the first threshold delay time ΔTHD1 is determined, the clock controller may reset the delay time of the first clock signal CLK1 to an initial delay time, until the output of the first sense amplifier does not match the test data pattern, the clock controller may reduce the delay time of the first clock signal CLK1.

Figure 9:
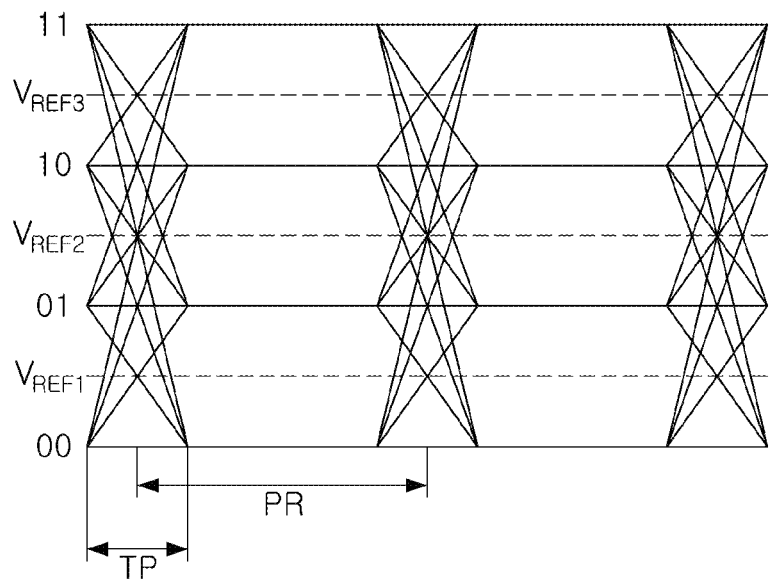
Figure 9:
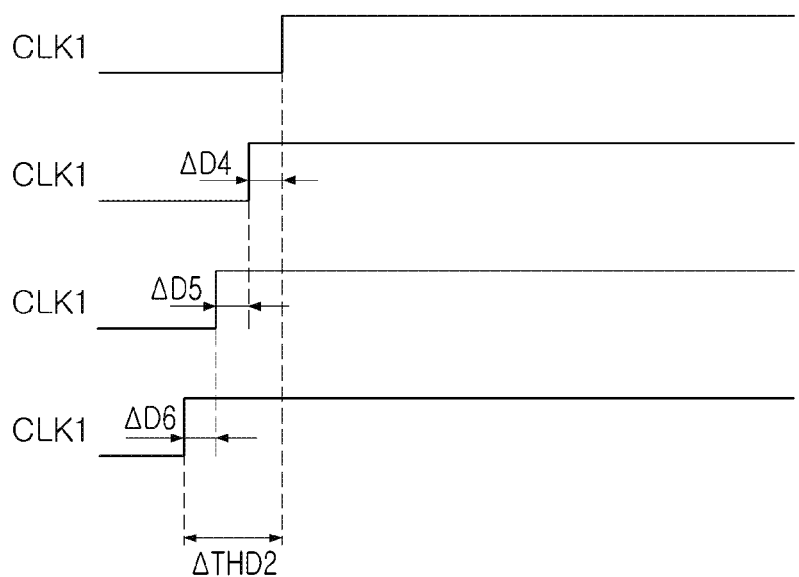

Referring to FIG. 9, a delay time of the first clock signal CLK1 may be reduced by a fourth delay amount ΔD4 based on an initial delay time, and tan output of the first sense amplifier may be compared with a test data pattern.

In an example embodiment, the output of the first sense amplifier may match the test data pattern. The clock controller may compare the output of the first sense amplifier with the test data pattern while sequentially decreasing the delay time of the first clock signal CLK1 by a fifth delay amount ΔD5 and a sixth delay amount ΔD6.

When the delay time of the first clock signal CLK1 decreases by the sum of the fourth to sixth delay amounts ΔD4 to ΔD6, a rising edge and a falling edge of the first clock signal CLK1 may overlap a first transition period TP1 of the multi-level signal MLS, and the output of the first senses amplifier may not match a test data pattern.

The clock controller may determine a second threshold delay time ΔTHD2 using the sum of the fourth to sixth delay amounts ΔD4 to ΔD6.

The clock controller may determine a first final delay time ΔFD1 using the first threshold delay time ΔTHD1 and the second threshold delay time ΔTHD2.

For example, the first final delay time ΔFD1 may be determined by the sum of the first threshold delay time ΔTHD1 and the second threshold delay time ΔTHD2, and the phase of the first clock signal CLK1 improved or optimized for the first sense amplifier may be determined by adding the first final delay time ΔFD1 to the initial delay time of the first clock signal CLK1.

Figure 10:
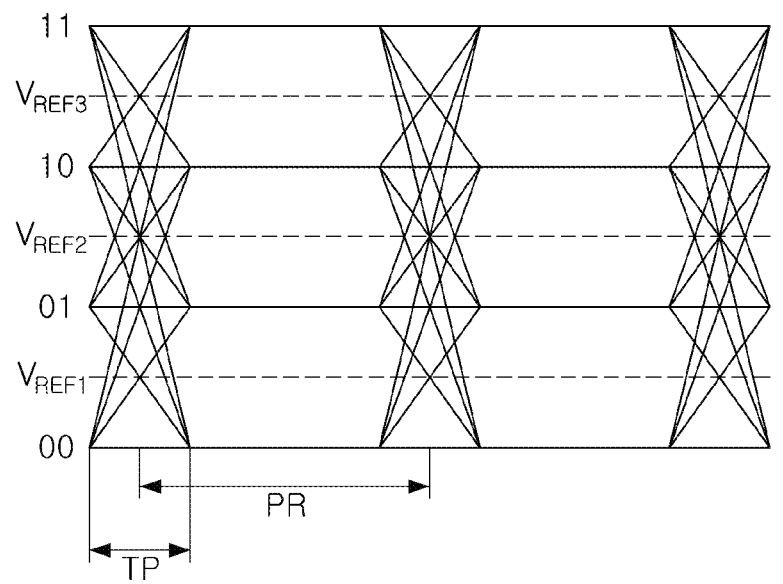
Figure 10:
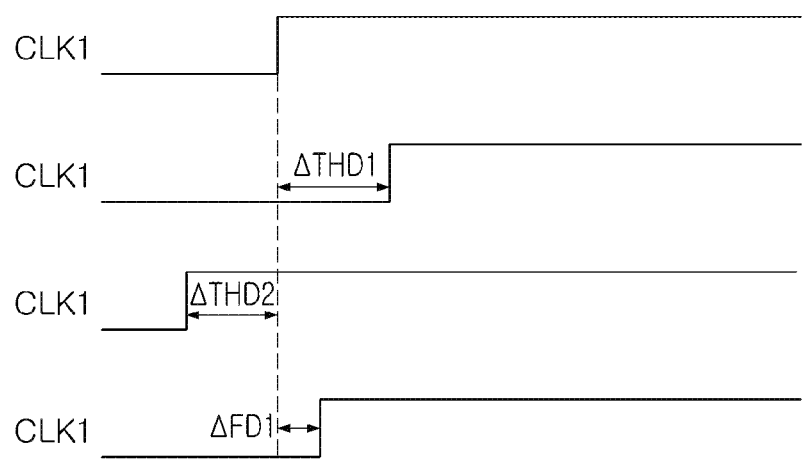
Figure 11:
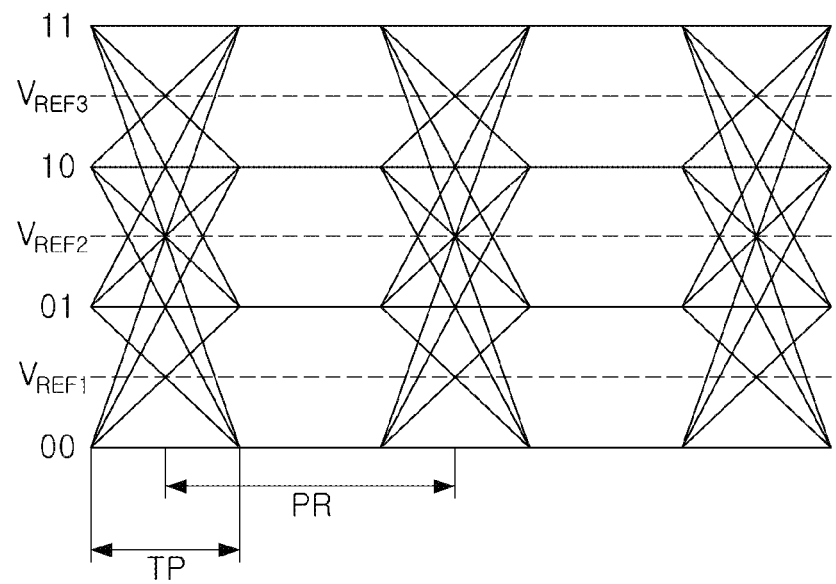
Figure 11:
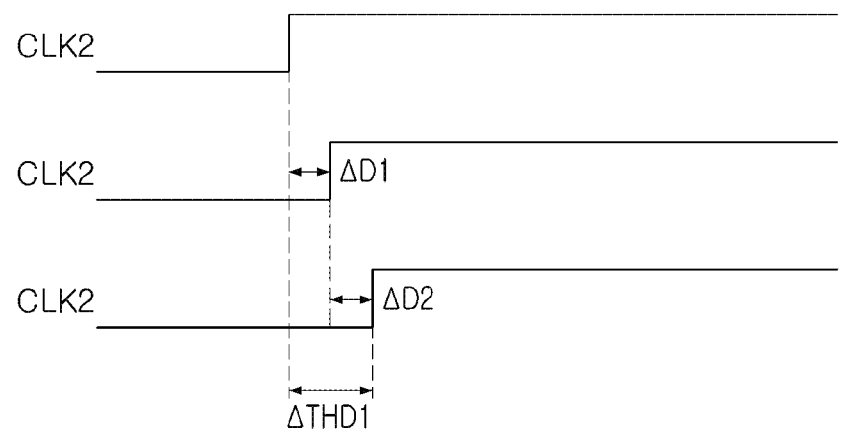
Figure 12:
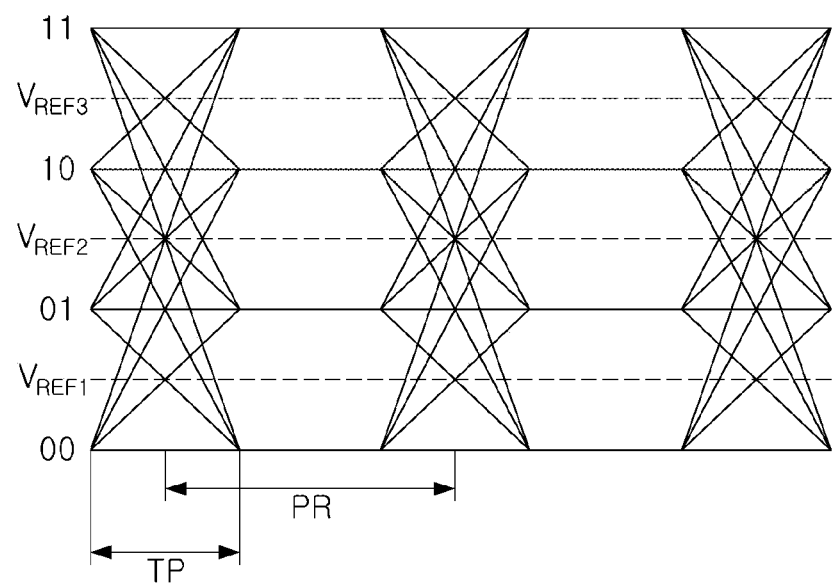
Figure 12:
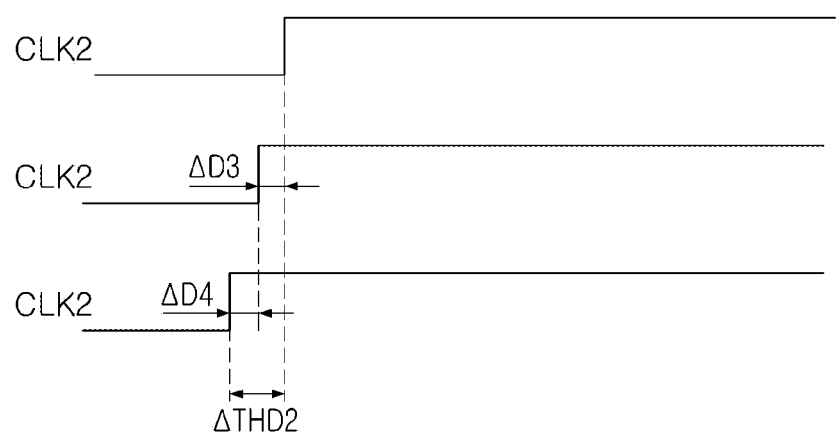
Figure 13:
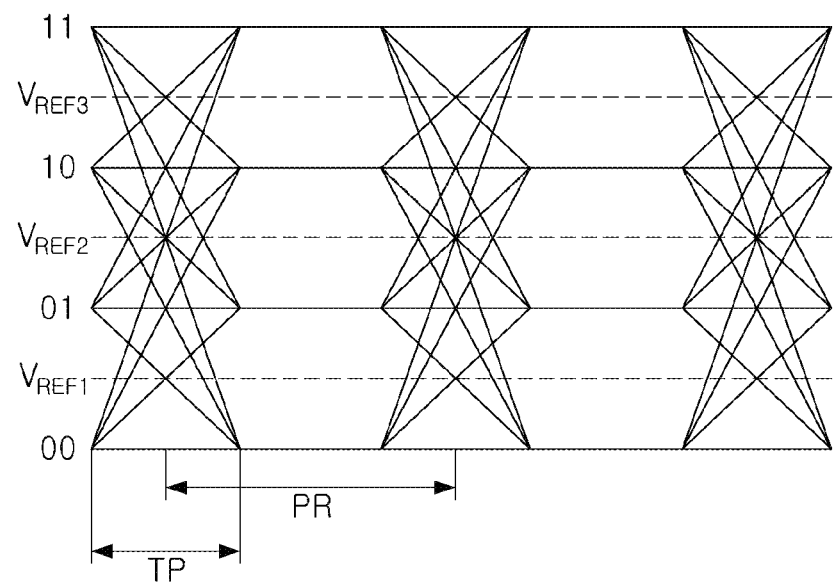
Figure 13:
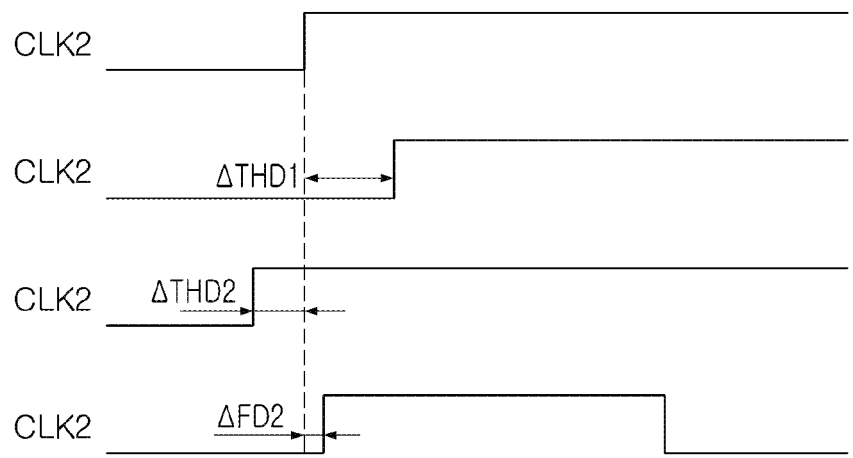

FIGS. 11 to 13 may be views illustrating a clock signal adjustment operation for a second sense amplifier receiving a multi-level signal MLS as in the example embodiments described with reference to FIGS. 8 to 10.

For example, the second sense amplifier may operate in synchronization with a second clock signal CLK2, different from the first clock signal CLK1. In addition, the multi-level signal MLS input to the first sense amplifier and the second sense amplifier may be the same signal transmitting the same data.

On the other hand, due to a difference in a routing wiring connected to each of the first sense amplifier and the second sense amplifier, parasitic capacitance, or the like, the multi-level signal MLS input to the second sense amplifier may have a second transition period TP2, different from the multi-level signal MLS input to the first sense amplifier.

First, referring to FIG. 11, the clock controller may compare the output of the second sense amplifier with the test data pattern while increasing a delay time of the second clock signal CLK2.

When the delay time of the second clock signal CLK2 increases by a first delay amount ΔD1, a rising edge and a falling edge of the second clock signal CLK2 may not overlap a second transition period TP2 of the multi-level signal MLS.

Accordingly, the output of the second sense amplifier may match a test data pattern, and the clock controller may further delay a delay time of the second clock signal CLK2 by a second delay amount (ΔD2).

When the delay time of the second clock signal CLK2 is further delayed by a second delay amount ΔD2, a rising edge and a falling edge of the second clock signal CLK2 may overlap a second transition period TP2 of the multi-level signal MLS. Therefore, the output of the second sense amplifier may not match the test data pattern.

The clock controller may determine the sum of the first delay amount ΔD1 and the second delay amount ΔD2 as a first threshold delay time ΔTHD1.

Next, referring to FIG. 12, the clock controller may compare the output of the second sense amplifier with the test data pattern while reducing a delay time of the second clock signal CLK2.

When the delay time of the second clock signal CLK2 decreases by a third delay amount ΔD3, a rising edge and a falling edge of the second clock signal CLK2 may not overlap a second transition period TP2 of the multi-level signal MLS.

Accordingly, the output of the second sense amplifier may match a test data pattern, and the clock controller may further reduce the delay time of the second clock signal CLK2 by a fourth delay amount ΔD4.

When the delay time of the second clock signal CLK2 further decreases by a fourth delay amount ΔD4, a rising edge and a falling edge of the second clock signal CLK2 may overlap the second transition period TP2 of the multi-level signal MLS. Therefore, the output of the second sense amplifier may not match a test data pattern. The clock controller may determine the sum of the third delay amount ΔD3 and the fourth delay amount ΔD4 as a second threshold delay time ΔTHD2.

The clock controller may determine a second final delay time ΔFD2 using the first threshold delay time ΔTHD1 and the second threshold delay time ΔTHD2. For example, the second final delay time ΔFD2 may be determined by the sum of the first threshold delay time ΔTHD1 and the second threshold delay time ΔTHD2, and the phase of the second clock signal CLK2 improved or optimized for the second sense amplifier may be determined by adding the second final delay time ΔFD2 to the initial delay time of the second clock signal CLK2.

In example embodiments described with reference to FIGS. 11 to 13, the delay amounts ΔD1 to ΔD4 and the threshold delay times ΔTHD1 and ΔTHD2 may be different from those in the example embodiments described with reference to FIGS. 8 to 10.

Therefore, the first final delay time ΔFD1 applied to the first clock signal CLK1 and the second final delay time ΔFD2 applied to the second clock signal CLK2 may be different from each other. The first clock signal CLK1 improved or optimized for the first sense amplifier and the second clock signal CLK2 improved or optimized for the second sense amplifier may have different phases from each other. In example embodiments of the present inventive concepts, by individually adjusting the phase of the clock signals in consideration of electrical characteristics of each of the sense amplifiers and electrical characteristics of a routing path inputting the multi-level signal MLS to each of the sense amplifiers, an operation performance of the multi-level receiver may be improved.

Figure 14:
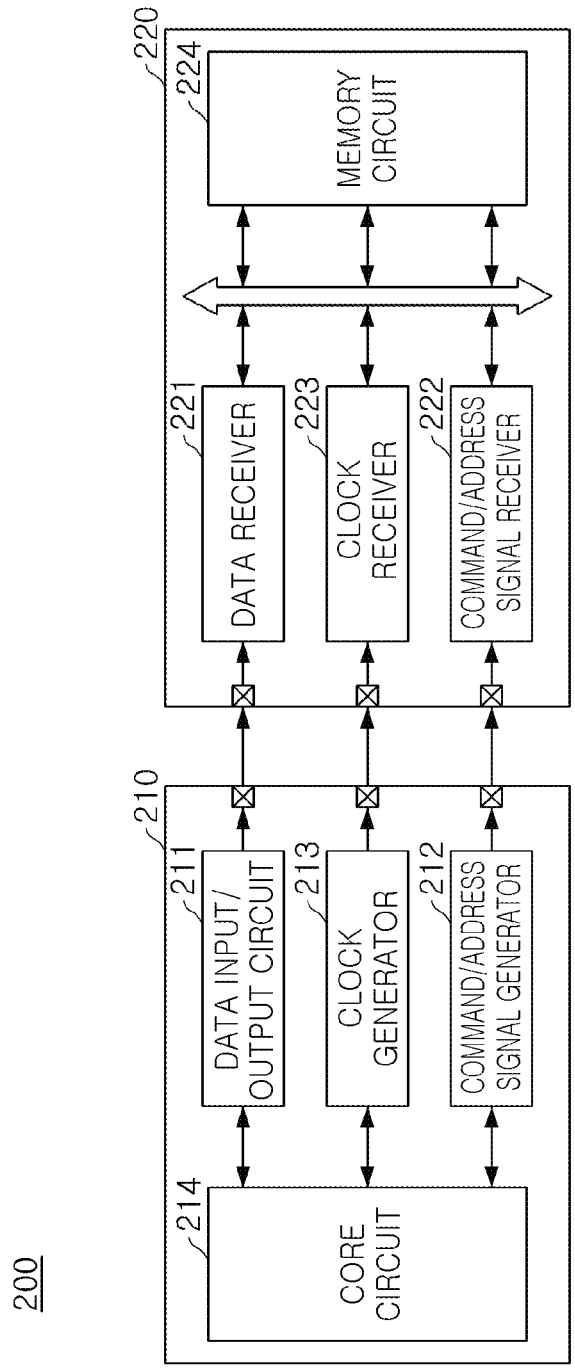
FIG. 14 is a view schematically illustrating a memory system according to example embodiments of the present inventive concepts.

FIG. 14 is a view schematically illustrating a memory system according to example embodiments of the present inventive concepts.

Referring to FIG. 14, a memory system 200 according to example embodiments of the present inventive concepts may include a controller 210 and a memory device 220 exchanging data. The controller 210 may transmit a clock signal, and a command/address signal, required for the operation of the memory device 220, a data signal, to be stored in the memory device 220, and/or the like, to the controller 210 in a form of a data signal.

The controller 210 may include a data input/output circuit 211 transmitting and receiving a data signal, a command/address signal generator 212 transmitting a command/address signal to the memory device 220, a clock generator 213 transmitting a clock signal to the memory device 220, a core circuit 214 controlling an overall operation of the controller 210, and/or the like. The memory device 220 may include a data transceiver 221 for inputting and outputting a data signal, a command/address signal receiver 222 for receiving a command/address signal, a clock receiver 223 for receiving a clock signal, a memory circuit 224, and/or the like. The memory circuit 224 may include a bank having memory cells.

At least one of signals transmitted between the controller 210 and the memory device 220 may be a multi-level signal. Hereinafter, for convenience of description, it is assumed that the data signal is a multi-level signal, but the clock signal and/or the command/address signal may also be a multi-level signal. When a data signal is a multi-level signal, N bits of data (where N is a natural number, higher than 2) may be transmitted between the controller 210 and the memory device 220 once per data transmission period.

The data transceiver 221 may generate data by restoring a data signal received from the controller 210. Data restored by the data transceiver 221 may be stored in the memory circuit 224. For example, the data transceiver 221 may be synchronized with a clock signal provided by the clock receiver 223 to restore a data signal transmitted by the controller 210 to data. Therefore, if the phase of the clock signal provided by the clock receiver was not accurately determined, an error may occur during a process of restoring data.

When the data signal is transmitted to a multi-level signal, the data transceiver 221 may compare the multi-level signal with a plurality of reference signals. The data transceiver 221 may include a plurality of sense amplifiers comparing a multi-level signal with a plurality of reference signals. However, electrical characteristics of the sense amplifiers, a length of a routing path through which data signals are transmitted to the sense amplifiers, and/or the like, may be different for each of the sense amplifiers. Therefore, when the phase of the clock signals is collectively determined, an error may occur in at least one of the sense amplifiers. In example embodiments of the present inventive concepts, by individually controlling the phase of the clock signal input to each of the sense amplifiers, an operation error of the data transceiver 221 can be reduced or prevented.

Figure 15:
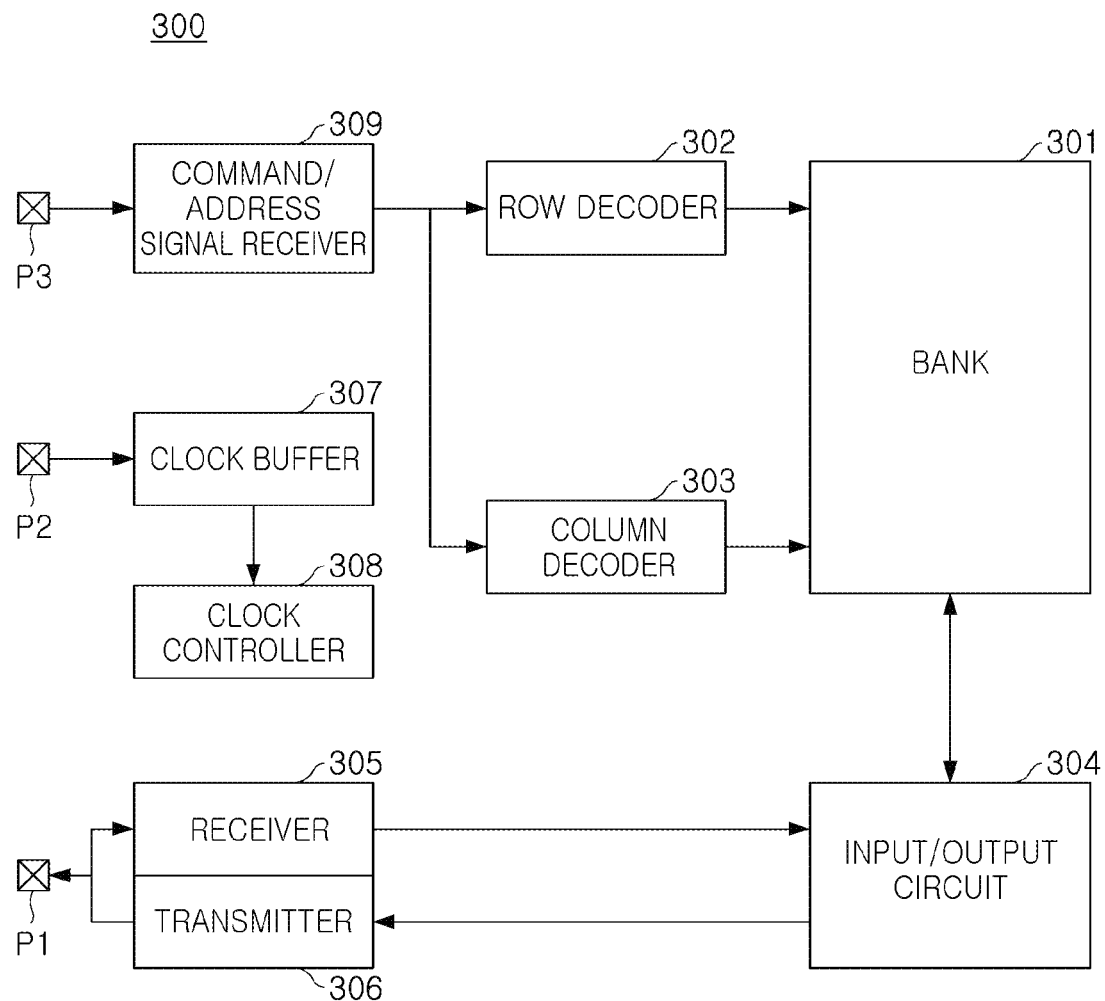
FIG. 15 is a view schematically illustrating a semiconductor device included in a memory system according to example embodiments of the present inventive concepts.

FIG. 15 is a view schematically illustrating a semiconductor device included in a memory system according to example embodiments of the present inventive concepts.

Referring to FIG. 15, the semiconductor device according to example embodiments of the present inventive concepts may be a memory device 300. The memory device 300 may include a bank 301 having memory cells, a row decoder 302, a column decoder 303, an input/output circuit 304, and/or the like. The row decoder 302 and the column decoder 303 may select at least one of the memory cells included in the bank 301, and the input/output circuit 304 may write data to the selected memory cells, or read data stored in the selected memory cells.

In addition, the memory device 300 may include a plurality of circuits connected to pins P1 to P3. For example, a receiver 305 and a transmitter 306 may be connected to the data pin P1, and the receiver 305 may transmit a data signal to an external controller. A clock buffer 307 and a clock controller 308 may be connected to the clock pin P2. The clock buffer 307 and the clock controller 308 may generate a clock signal required for the operation of the memory device 300 by using a reference clock received from an external controller. A command/address signal receiver 309 may be connected to the command/address pin P3.

For example, at least one of the signals received from an external controller may be a multi-level signal. For example, a data signal transmitted and received through the data pin P1 may be a multi-level signal. The receiver 305 may be synchronized with a clock signal provided by the clock controller 308 to restore data received as a multi-level signal. For example, the receiver 305 may restore data by comparing the multi-level signal with a predetermined or alternatively, desired reference signal for each rising edge and falling edge of the clock signal.

Figure 16:
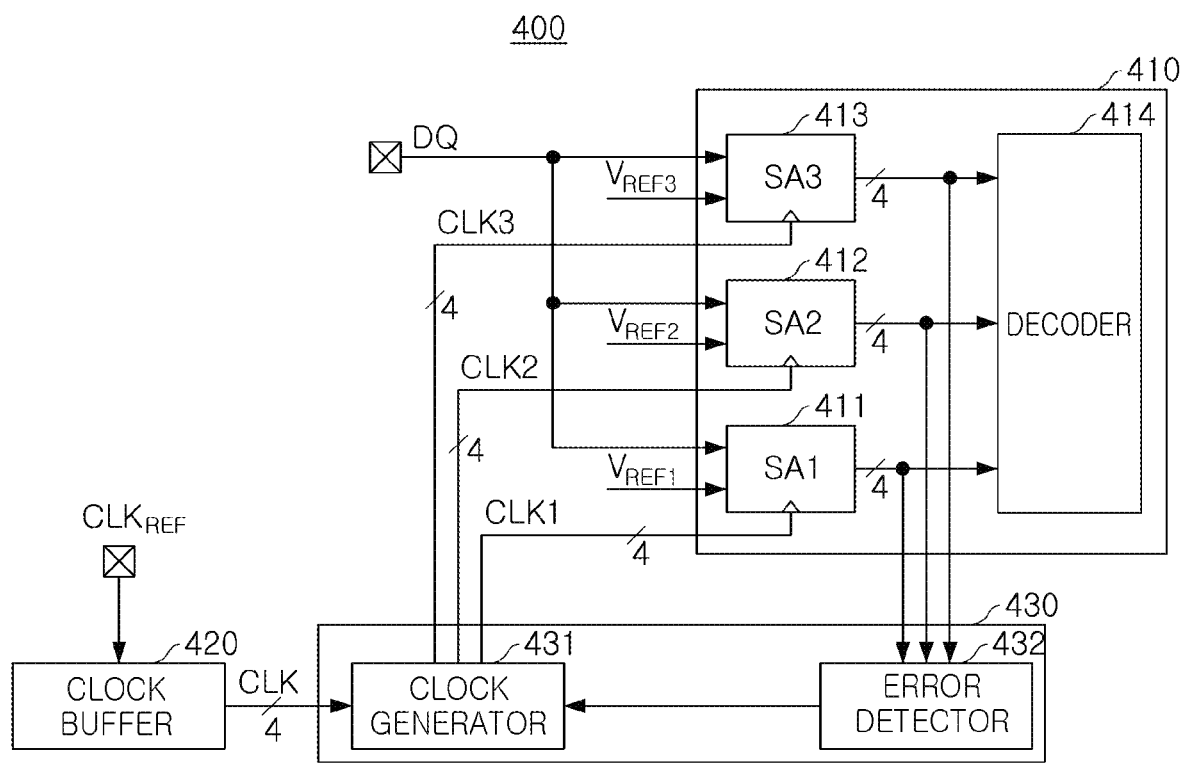
FIGS. 16 and 17 are views schematically illustrating a semiconductor device according to example embodiments of the present inventive concepts.
Figure 17:
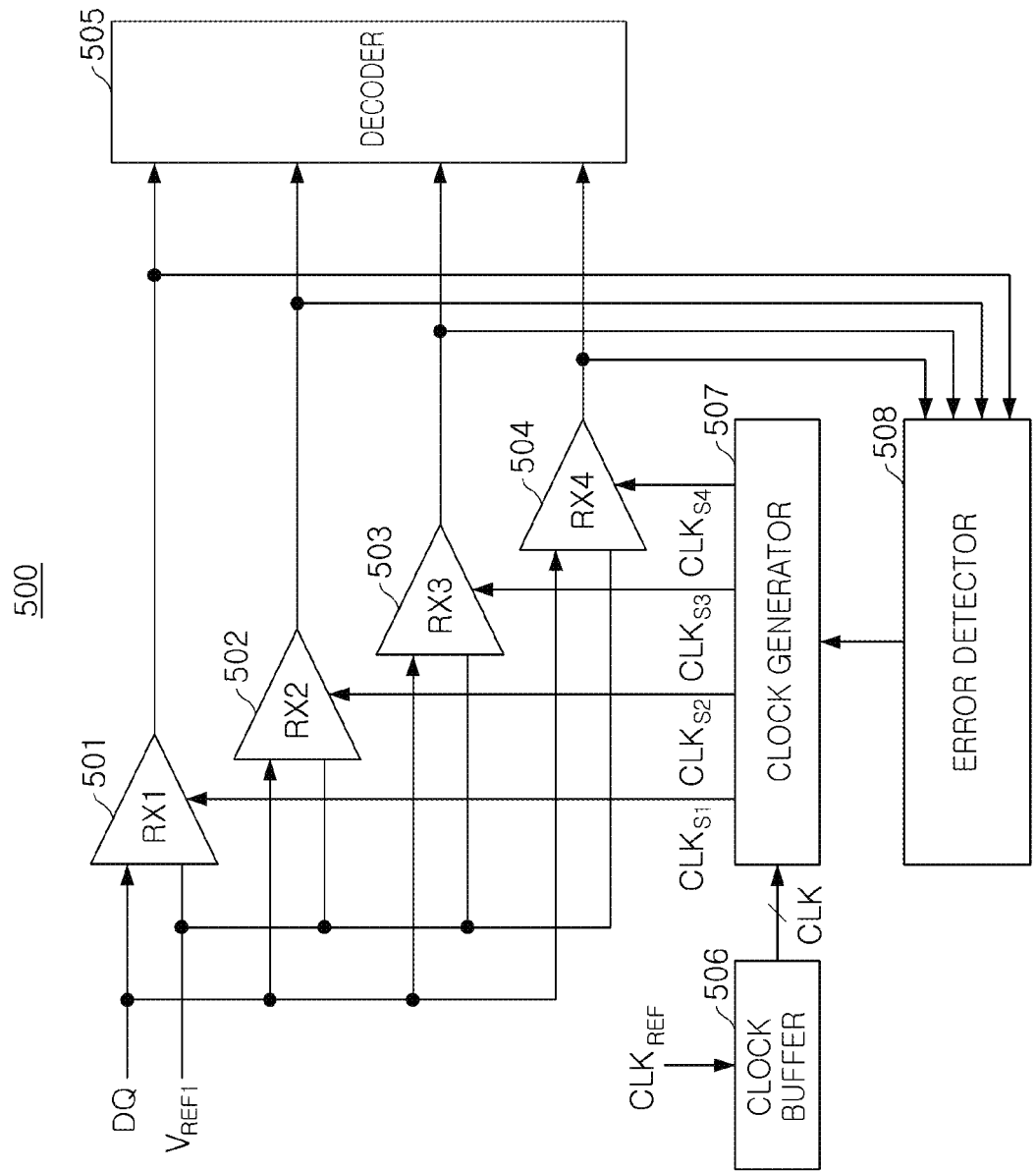

FIGS. 16 and 17 are views schematically illustrating a semiconductor device according to example embodiments of the present inventive concepts.

Referring to FIG. 16, a semiconductor device 400 according to example embodiments of the present inventive concepts may include a multilevel receiver 410, a clock buffer 420, a clock controller 430, and/or the like. The multi-level receiver 410 may include a plurality of sense amplifiers 411-413 for receiving a data signal DQ transmitted as the multi-level signal, and a decoder 414 for decoding outputs of the sense amplifiers 411 to 413. In example embodiments, the data signal DQ may be a multi-level signal having M levels (where M is a natural number, higher than 2), and the number of sense amplifiers 411 to 413 may be N (where N is a natural number, lower than M). For example, according to a transmission speed of the data signal DQ, M may be defined as a power of 2, and N may be defined as M−1.

The clock buffer 420 may receive a reference clock signal $CLK_{REF}$, and phase shift the reference clock signal $CLK_{REF}$ by 90 degrees, 180 degrees, and 270 degrees to provide four sub-clock signals CLK to the clock controller 430. However, according to example embodiments, the clock buffer 420 may receive a plurality of reference clock signals. For example, the clock buffer 420 may receive a first reference clock signal and a second reference clock signal, which is a complementary signal of the first reference clock signal, as a differential signal.

The clock controller 430 may generate N clock signals CLK1 to CLK3 input to the N sense amplifiers 111 to 113. For example, each of the N clock signals CLK1 to CLK3 may include the first to fourth sub-clock signals, and the second to fourth sub-clock signals may be clock signals that are phase shifted by 90 degrees, 180 degrees, and 270 degrees based on the first sub-clock signal. However, according to example embodiments, the clock buffer 420 may transmit the reference clock signal $CLK_{REF}$ to the clock controller 430, and the clock controller 430 may phase shift the reference clock signal $CLK_{REF}$ to generate a plurality of sub-clock signals.

The first sense amplifier 411 may operate according to the first clock signal CLK1 to compare the data signal DQ with a first reference signal $V_{REF1}$, and the second sense amplifier 412 may operate according to the second clock signal CLK2 to compare the data signal DQ with a second reference signal $V_{REF2}$. The third sense amplifier 413 may operate according to the third clock signal CLK3 to compare the data signal DQ with a third reference signal $V_{RFF3}$.

The data signal DQ input to the sense amplifiers 411 to 413 may have a different phase due to a difference in electrical characteristics of a path through which the data signal DQ is transmitted and each of the sense amplifiers 411 to 413, or may have different transition periods. In example embodiments of the present inventive concepts, the clock controller 130 may individually control the phase of each of the clock signals CLK1 to CLK3 using the output of each of the sense amplifiers 411 to 413. The clock controller 430 may include a clock generator 431 determining the phase of each of the clock signals CLK1 to CLK3, an error detector 432 detecting the output of each of the sense amplifiers 411 to 413, and/or the like. In example embodiments, the clock generator 431 may include a plurality of delay cells determining the delay time of each of the clock signals CLK1 to CLK3 so that the phase of each of the clock signals CLK1 to CLK3 can be controlled individually. The clock generator 431 may be a multi-phase clock generator.

Referring to FIG. 17, the semiconductor device 500 may include a plurality of unit sense amplifiers 501 to 504, a decoder generating data using an output of the unit sense amplifiers 501 to 504, a clock buffer 506, a clock generator 507, an error detector 508, and/or the like. The clock buffer 506 may receive a reference click signal $CLK_{REF}$ from an external controller, or the like, and transmit a plurality of sub-clock signals CLK generated by phase shifting the reference clock signal $CLK_{REF}$ to the clock generator 507.

The clock generator 507 may adjust phases of the plurality of sub-clock signals CLK received from the clock buffer 506 to generate sub-clock signals $CLK_{S1}$ to $CLK_{S4}$ input to the unit sense amplifiers 501 to 504. The clock generator 507 may improve or optimize the phase of each of the sub clock signals $CLK_{S1}$ to $CLK_{S4}$ to suit the unit sense amplifiers 501 to 504, with reference to the output of each of the unit sense amplifiers 501 to 504 detected by the error detector 508.

The error detector 508 may detect whether an error exists in the output of each of the unit sense amplifiers 501 to 504. For example, when at least one rising edge and one falling edge of the sub-clock signals $CLK_{S1}$ to $CLK_{S4}$ overlap a transition period of the data signal DQ, an error may occur in at least one of the unit sense amplifiers 501 to 504. When an error is detected, an operation of adjusting the phases of the sub-clock signals $CLK_{S1}$ to $CLK_{S4}$ may be performed.

In example embodiments, an operation of adjusting the phases of the sub-clock signals $CLK_{S1}$ to $CLK_{S4}$ may also be performed, once per predetermined or alternatively, desired period or in a specific operation mode of the semiconductor device 500. For example, when the semiconductor device 500 is a dynamic random access memory DRAM, while a refresh operation on memory cells is performed in the semiconductor device 500, an operation of adjusting the phases of the sub-clock signals $CLK_{S1}$ to $CLK_{S4}$ can be executed. Therefore, without a separate operation time, the phases of the sub-clock signals $CLK_{S1}$ to $CLK_{S4}$ may be adjusted during a continuous operation of the semiconductor device 500 to accurately receive the data signal DQ.

FIGS. 18 to 22 are views provided to illustrate an operation of a semiconductor device according to example embodiments of the present inventive concepts. Hereinafter, for convenience of description, an operation of the semiconductor device 500 will be described with reference to FIG. 17.

In the semiconductor device 500 according to example embodiments of the present inventive concepts, unit sense amplifiers 501 to 504 receiving a multi-level signal, for example, a data signal DQ, may operate in synchronization with sub-clock signals $CLK_{S1}$ to $CLK_{S4}$.

Figure 18:
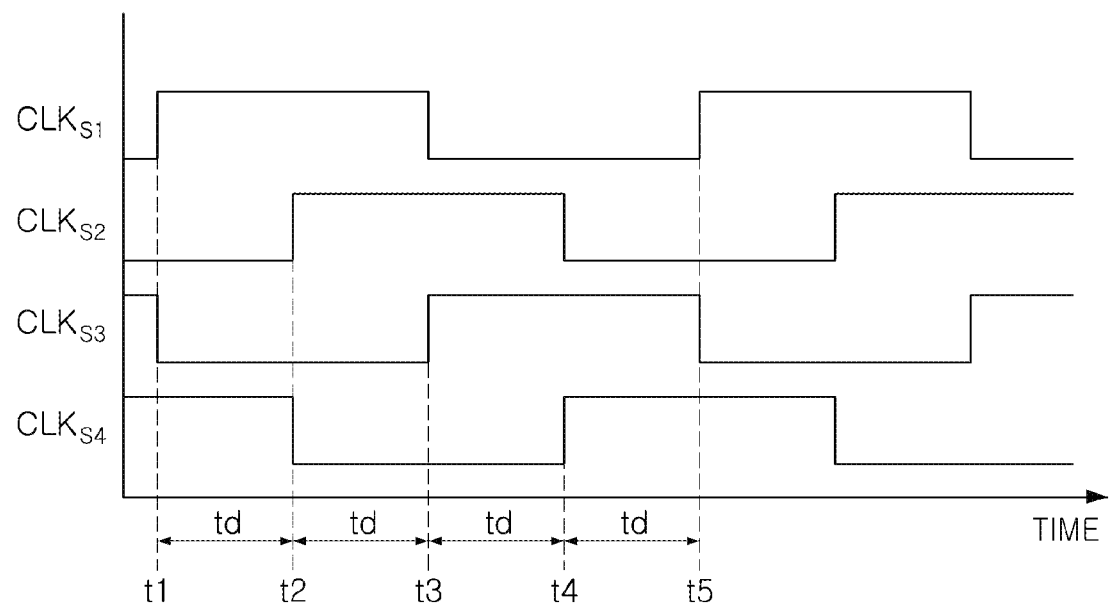
FIGS. 18 to 22 are views provided to illustrate an operation of the semiconductor device according to example embodiments of the present inventive concepts.

First, referring to FIG. 18, the second to fourth sub-clock signals $CLK_{S2}$ to $CLK_{S4}$ may be signals generated by phase shifting the first sub-clock signal $CLK_{S1}$ by 90 degrees, 180 degrees, and 270 degrees. Accordingly, a predetermined or alternatively, desired delay time td may exist between the sub-clock signals $CLK_{S1}$ to $CLK_{S4}$.

Figure 19:
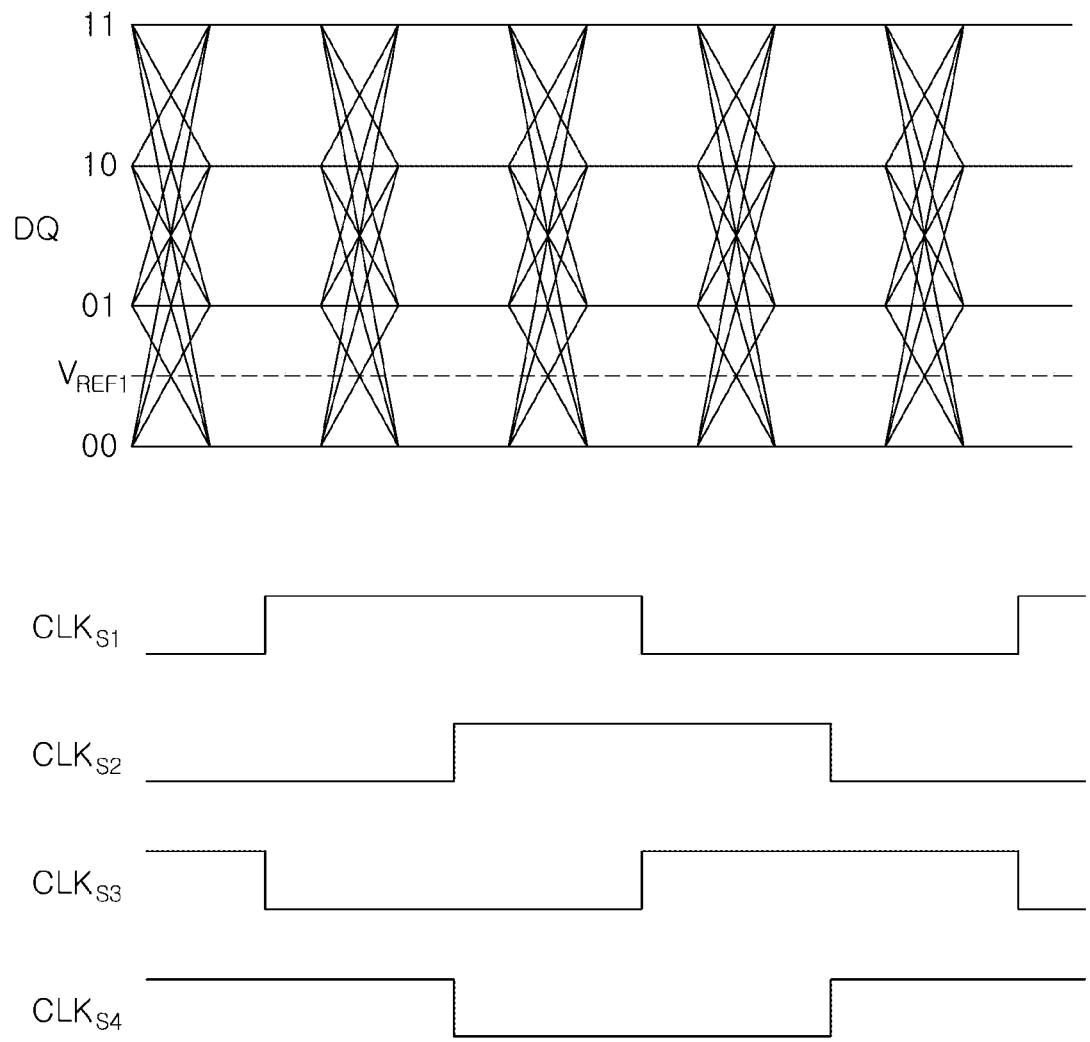

Referring to FIG. 19, the data signal DQ may be a signal generated by a 4-level pulse amplitude modulation method having total four levels LV1 to LV4. Accordingly, the semiconductor device 500 may receive two data bits during one data transmission period PR. In order to determine the phase of the first to fourth sub-clock signals $CLK_{S1}$ to $CLK_{S4}$ input to the unit sense amplifiers 501 to 504, the sub-clock signals $CLK_{S1}$ to $CLK_{S4}$ set to have a predetermined or alternatively, desired initial delay time may be input to the unit sense amplifiers 501 to 504. For example, by phase shifting the first sub-clock signal $CLK_{S1}$ by 90 degrees, 180 degrees, and 270 degrees, t sub-clock signals $CLK_{S2}$ to $CLK_{S4}$ may be generated. In example embodiments, a period of the sub-clock signals $CLK_{S1}$ to $CLK_{S4}$ may be twice a period of the data signal DQ.

Figure 20:
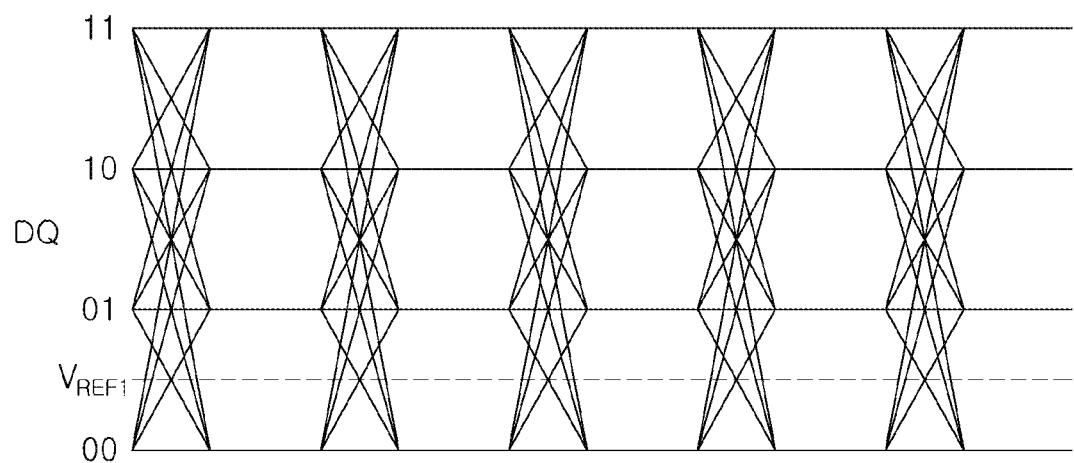
Figure 20:
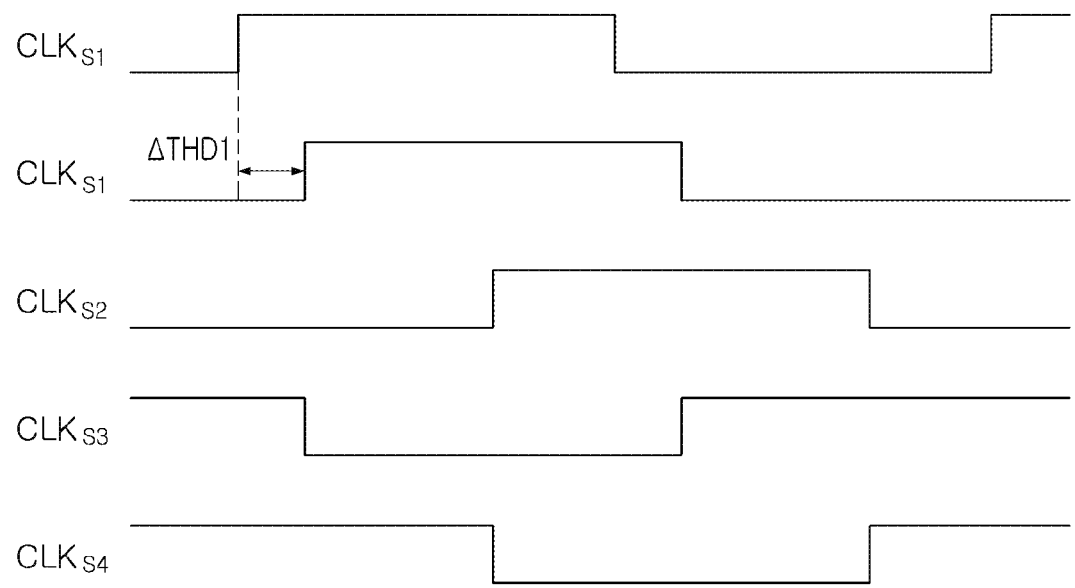

Next, referring to FIG. 20, a first threshold delay time ΔTHD1 may be found by delaying the phase of the sub-clock signals $CLK_{S1}$ to $CLK_{S4}$. For example, the clock generator 507 may delay each of the sub-clock signals $CLK_{S1}$ to $CLK_{S4}$ by a predetermined or alternatively, desired delay amount, and the error detector 508 may detect the output of the unit sense amplifiers 501 to 504. The clock generator 507 may determine the first threshold delay time ΔTHD1 while increasing the delay time of the sub-clock signals $CLK_{S1}$ to $CLK_{S4}$ until it is determined that an error exists in the output of the unit sense amplifiers 501 to 504 by the error detector 508.

Figure 21:
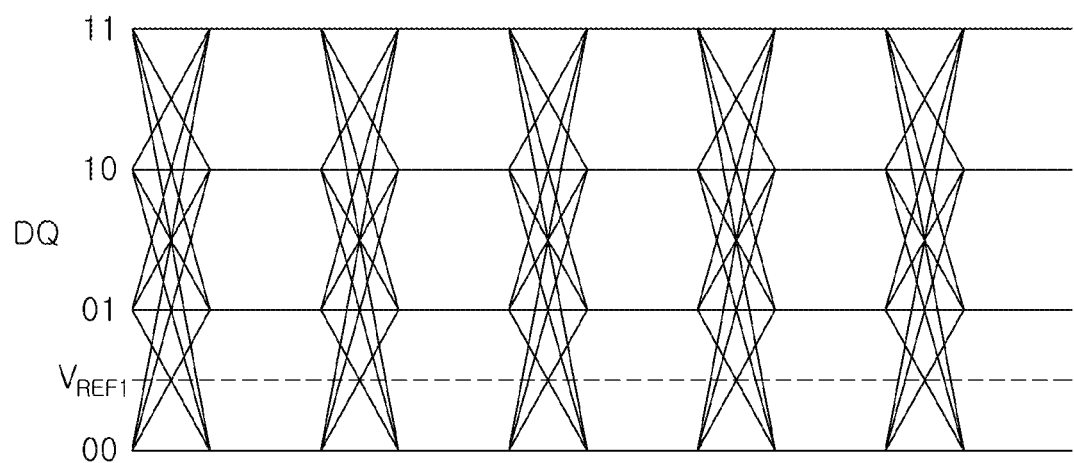
Figure 21:
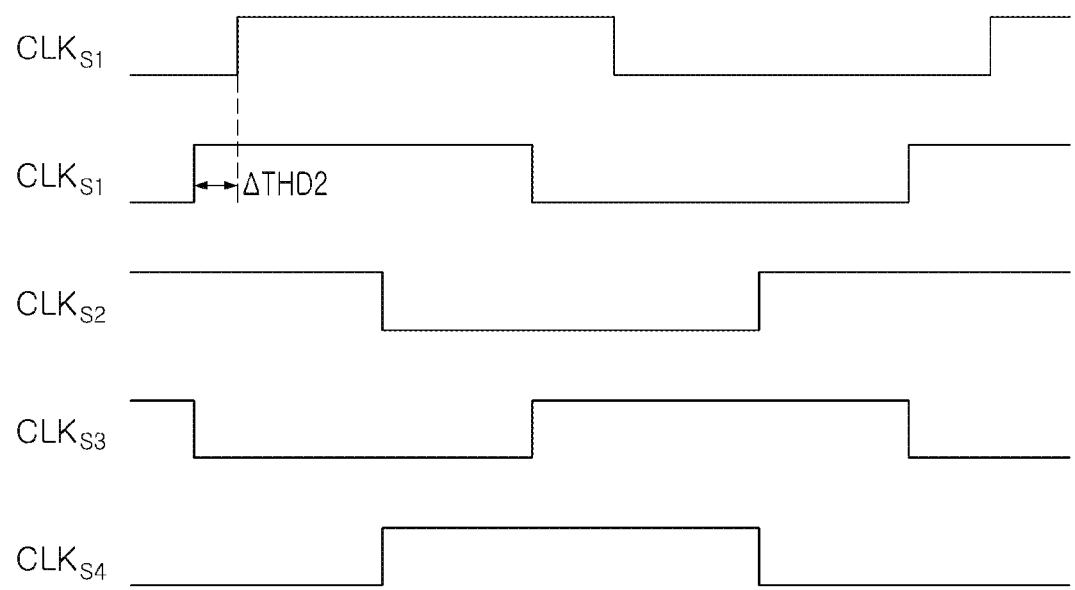

When the first threshold delay time ΔTHD1 is determined, a second threshold delay time ΔTHD2 may be found. For example, as shown in FIG. 21, the clock generator 507 may advance each of the sub-clock signals $CLK_{S1}$ to $CLK_{S4}$ by a predetermined or alternatively, desired amount of delay, and the error detector 508 may detect the output of the unit sense amplifiers 501 to 504. The clock generator 507 may advance the phase of the sub-clock signals $CLK_{S1}$ to $CLK_{S4}$ until it is determined that an error exists in the output of the unit sense amplifiers 501 to 504 by the error detector 508, and determine the second threshold delay time ΔTHD2.

The clock generator 507 may determine a final delay time ΔFD using the first threshold delay time ΔTHD1 and the second threshold delay time ΔTHD2. The final delay time ΔFD may be determined as a difference between the first threshold delay time ΔTHD1 and the second threshold delay time ΔTHD2. The clock generator 507 advances or delays the phase of each of the sub-clock signals $CLK_{S1}$ to $CLK_{S4}$ by the final delay time ΔFD, such that an operation timing of the unit sense amplifiers 501-504 may be improved or optimized.

Figure 22:
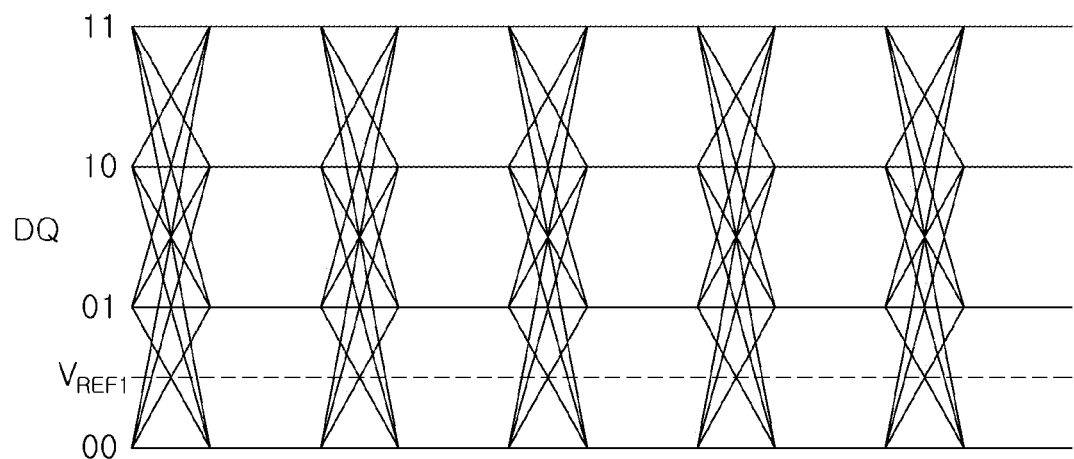
Figure 22:
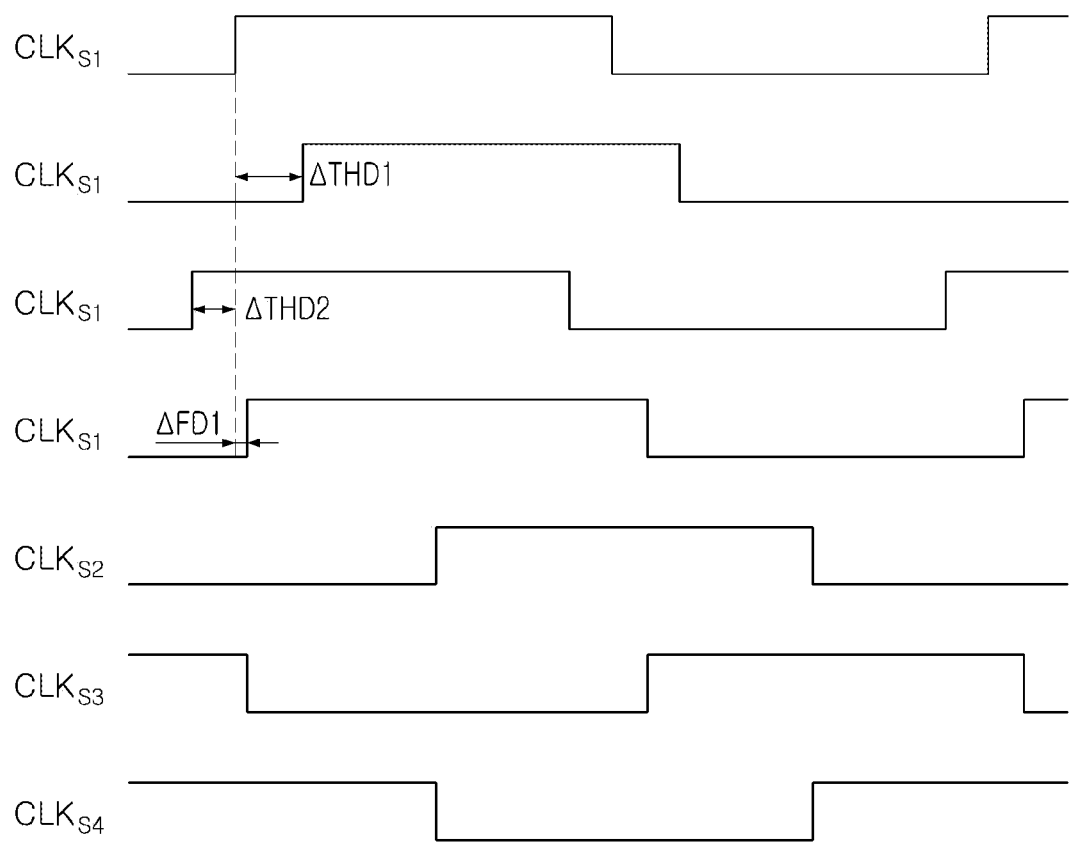

As shown in FIG. 22, when the first threshold delay time ΔTHD1 is greater than the second threshold delay time ΔTHD2, the phase of each of the sub-clock signals $CLK_{S1}$ to $CLK_{S4}$ may be delayed by a final delay time ΔFD. Conversely, when the first threshold delay time ΔTHD1 is lower than the second threshold delay time ΔTHD2, the phase of each of the sub-clock signals $CLK_{S1}$ to $CLK_{S4}$ may be advanced by the final delay time ΔFD.

The clock generator 507 may individually adjust the final delay time ΔFD of each of the sub-clock signals CLK$_{S1}$ to CLK$_{S4}$. According to example embodiments, the final delay time ΔFD may be determined differently from at least some of the sub-clock signals CLK$_{S1}$ to CLK$_{S4}$. Alternately, one of the sub-clock signals CLK$_{S1}$ to CLK$_{S4}$, for example, a final delay time ΔFD of the first sub-clock signal CLK$_{S1}$ is calculated, and the first sub-clock signal CLK$_{S1}$ to which the final delay time ΔFD is reflected may be delayed by 90 degrees, 180 degrees, and 270 degrees, to generate second to fourth sub-clock signals CLK$_{S2}$ to CLK$_{S4}$. As shown in FIG. 22, by receiving the data signal DQ using the first to fourth sub-clock signals CLK$_{S1}$ to CLK$_{S4}$, a sampling time may be shortened and a data transmission rate may be increased.

Figure 23:
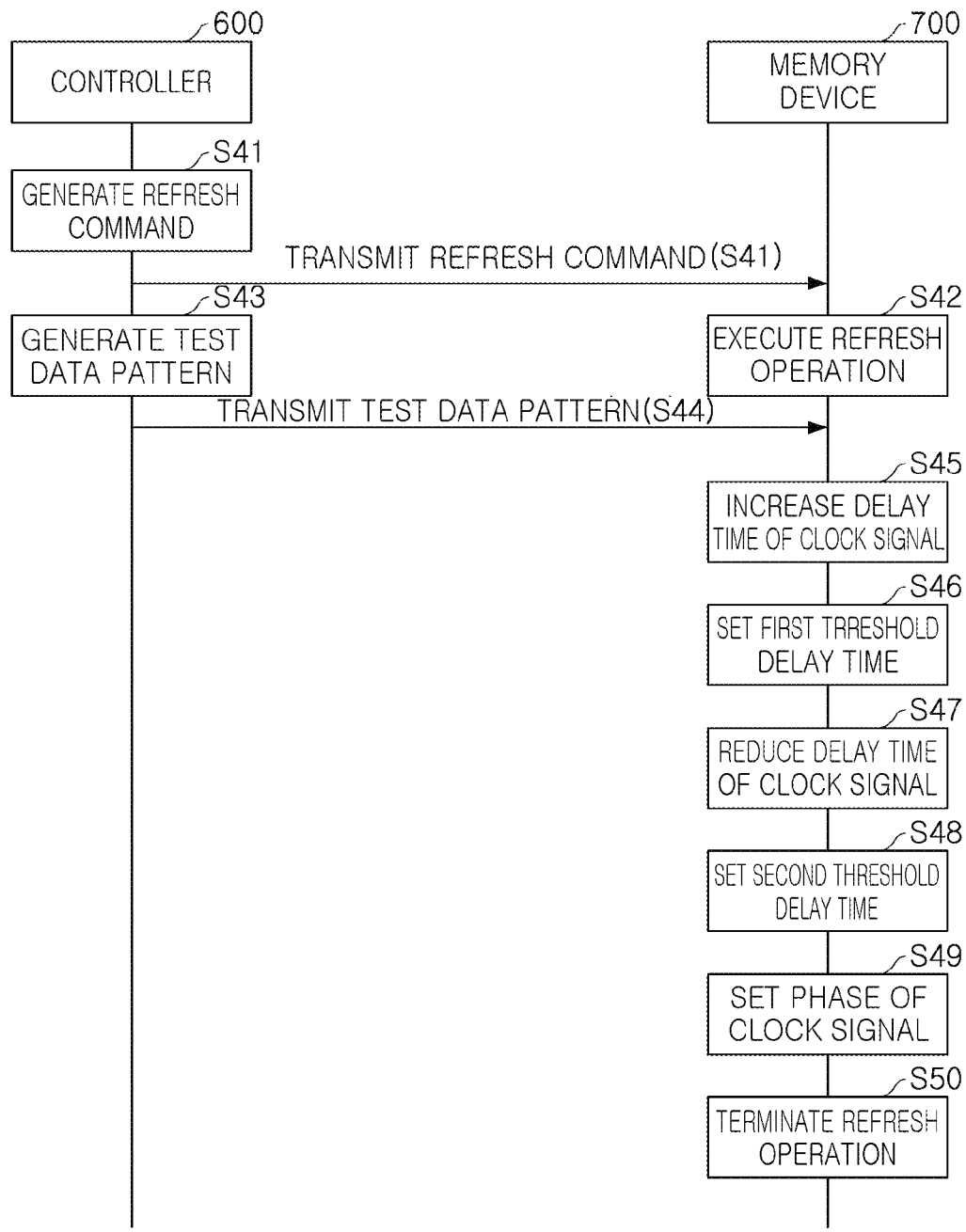
FIG. 23 is a view provided to illustrate an operation of a memory system according to example embodiments of the present inventive concepts.

FIG. 23 is a view provided to illustrate an operation of a memory system according to example embodiments of the present inventive concepts.

Referring to FIG. 23, a memory system according to example embodiments of the present inventive concepts may include a controller 600 and a memory device 700, and the controller 600 and the memory device 700 may transmit and receive signals with each other through a plurality of pins. For example, the controller 600 may transmit a command/address signal, a data signal, a data strobe signal, a clock signal, and/or the like to the memory device 700, and the memory device 700 may output a data signal read in response to a control of the controller 600 to the controller 600.

In the operation of the memory system according to example embodiments of the present inventive concepts, the controller 600 may generate a refresh command (S40), and the operation may be started by transmitting the refresh command to the memory device 700. For example, the memory device 700 may be a volatile dynamic random access memory, and may perform a refresh operation of refreshing data of memory cells in response to the refresh command (S42).

The controller 600 that has transmitted the refresh command to the memory device 700 may generate a test data pattern (S43). The test data pattern may be a Pseudo Random Binary Sequence (PRBS) pattern, and may be transmitted to the memory device 700 (S44). While a refresh operation on memory cells is performed, the memory device 700 may perform a clock adjustment operation for optimizing an operation timing of a receiver receiving a signal from the controller 600.

For example, in a clock adjustment operation, a multi-level receiver connected to pins receiving a multi-level signal from the controller 600 may receive a test data pattern. In example embodiments, the multi-level receiver may be connected to at least one of data signal (DQ) pins, data strobe signal (DQS) pins, and command/address signal (CA) pins, to receive a multi-level signal. In example embodiments, the multi-level signal may be a signal generated by a pulse amplitude modulation method.

The operation timing of the multi-level receiver may be determined by a clock controller inputting a clock signal to the multi-level receiver. The clock controller may increase a delay time of a clock signal input to the multi-level receiver, while the multi-level receiver receives a test data pattern (S45). When the delay time of the clock signal increases and the output of the multi-level receiver do not match the test data pattern, the clock controller may set the corresponding delay time as a first threshold delay time (S46).

Next, the clock controller may reduce a delay time of the clock signal input to the multi-level receiver (S47). When the delay time of the clock signal decreases and the output of the multi-level receiver do not match the test data pattern, the clock controller may set the corresponding delay time as a second threshold delay time (S48). The clock controller may determine the phase of the clock signal using the first threshold delay time and the second threshold delay time (S49), and then a refresh operation may be terminated (S50). However, according to example embodiments, the refresh operation may be terminated first.

When the refresh operation is terminated, the multi-level receiver of the memory device 700 may operate in synchronization with a clock signal having an adjusted phase. For example, through the pin receiving the test data pattern during the refresh operation, after the refresh operation is terminated, the multi-level receiver may receive at least one of a data signal (DQ), a data strobe signal (DQS), and a command/address signal (CA) as a multi-level signal, The multi-level signal can be decoded into data according to the timing provided by the clock signal of the adjusted phase.

Figure 24:
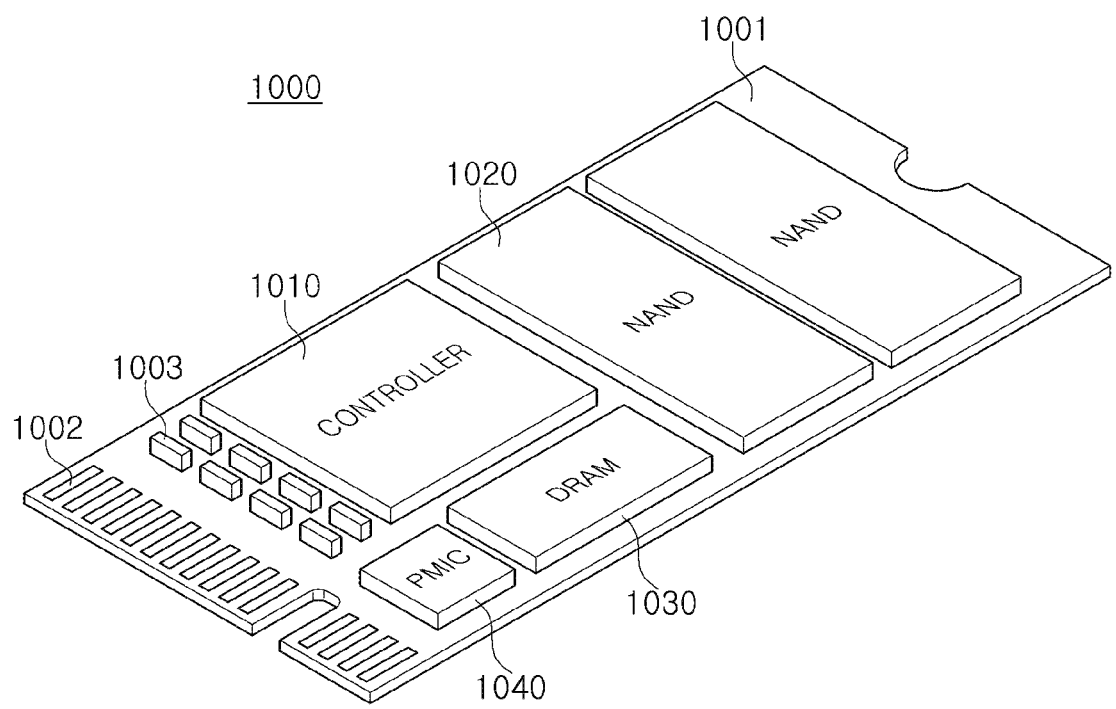
FIG. 24 is a view schematically illustrating a memory system according to example embodiments of the present inventive concepts.

FIG. 24 is a view schematically illustrating a memory system according to example embodiments of the present inventive concepts.

The memory system 1000 according to example embodiments illustrated in FIG. 24 may be a solid state drive (SSD). The memory system 1000 may have a form factor according to the M.2 standard, and may communicate with an external central processing unit, a system-on-chip, an application processor, or the like, according to a Peripheral Component Interconnect Express (PCIe) protocol.

The memory system 1000 may include a system substrate 1001, connector pins 1002 and component elements 1003 formed on the system board 1001, a controller 1010 mounted on the system board 1001, a NAND memory 1020, a DRAM 1030, a PMIC 1040, and/or the like. The connector pins 1002 may contact pins of a computer device and/or a server device to which the memory system 1000 is mounted. The component elements 1003 may include passive elements such as resistors and capacitors required for the operation of the memory system 1000.

The controller 1010 may control the memory system 1000 according to a control command from a computer device and/or a server device. The controller 1010 may store data received through the connector pins 1002 in the NAND memory 1020 and/or the DRAM 1030, or reads data stored in the NAND memory 1020 and/or the DRAM 1030 to be output to the computer device and/or the server device. The PMIC 1040 may distribute power supplied through the connector pins 1002 to the controller 1010, the NAND memory 1020, the DRMA 1030, and/or the like.

The controller 1010 may be connected to the NAND memory 1020 and the DRAM 1030 through wirings formed on the system substrate 1001. For example, the controller 1010 may generate a data signal, or the like in a pulse amplitude modulation method and transmit it to the NAND memory 1020 and/or DRAM 1030. The multi-level receiver of the NAND memory 1020 and/or the DRAM 1030 receiving a data signal in a pulse amplitude modulation type data signal or the like may operate in synchronization with a clock signal received from the controller 1010. As previously described with reference to FIGS. 1 to 23, the NAND memory 1020 and/or the DRAM 1030 may include a clock controller individually adjusting the phase of each of the clock signals input to the sense amplifiers included in the multi-level receiver.

Figure 25:
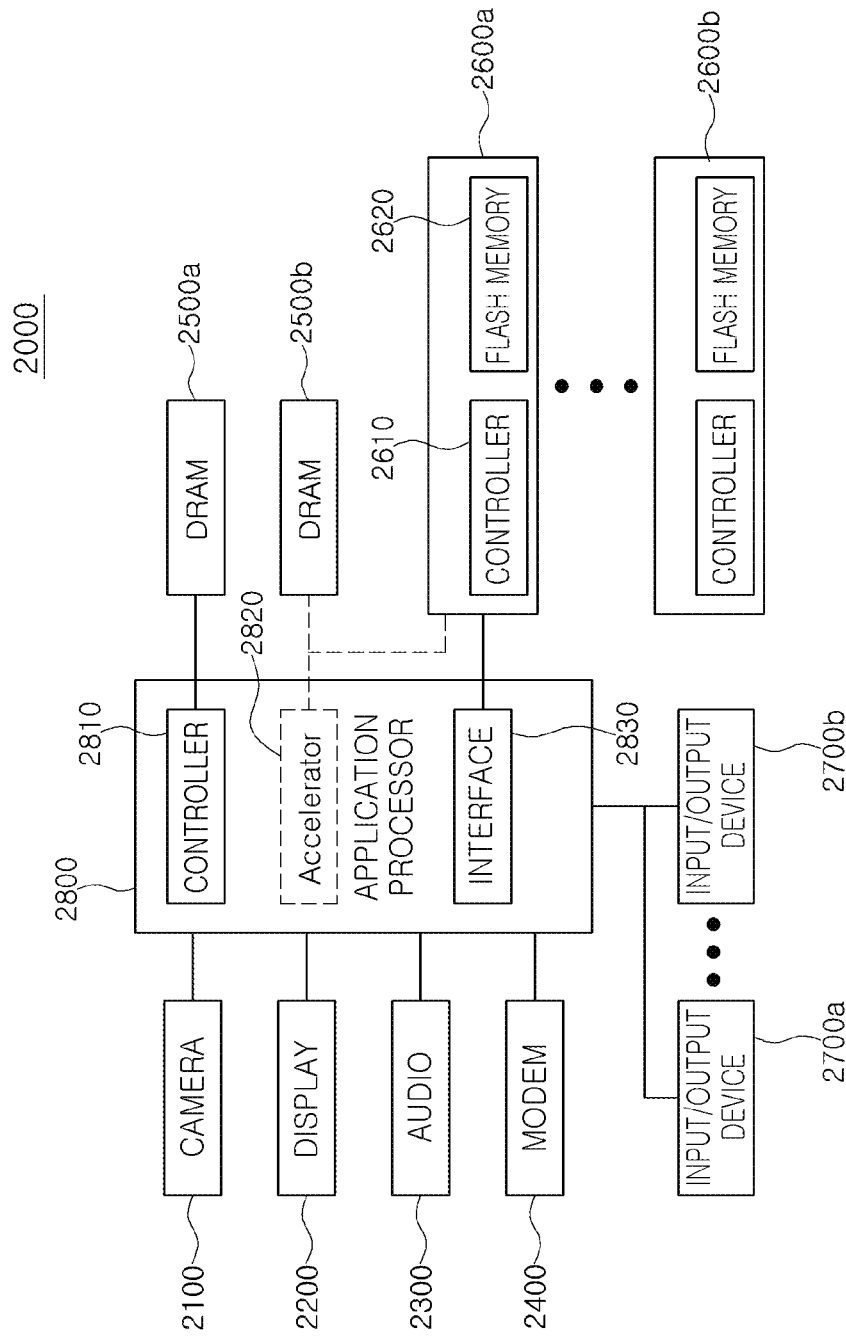
FIG. 25 is a view schematically illustrating a mobile system including a semiconductor device according to example embodiments of the present inventive concepts.

FIG. 25 is a view schematically illustrating a mobile system including a semiconductor device according to example embodiments of the present inventive concepts.

Referring to FIG. 25, a mobile system 2000 may include a camera 2100, a display 2200, an audio processing unit 2300, a modem 2400, DRAMs 2500a and 2500b, flash memory devices 2600a and 2600b, and an application processor (hereinafter, "AP") 2800. The mobile system 2000 may be implemented as a laptop computer, a portable terminal, a smartphone, a table PC, a wearable device, a healthcare device, or an Internet-of-Things (IoT) device. In addition, the mobile system 2000 may be implemented as a server or a personal computer.

The camera 2100 may capture a still image or a video under an user's control. The mobile system 2000 may acquire specific information by using a still image/video captured by the camera 2100 or may convert and store the still image/video into other types of data such as text, or the like. Alternatively, the mobile system 2000 may recognize a character string included in the still image/video captured by the camera 2100 and may also provide a text or audio translation corresponding to the character string. As described above, fields of application of the camera 2100 in the mobile system 2000 are becoming increasingly diverse. In example embodiments, the camera 2100 may transmit data such as still images/videos to the AP 2800 according to a D-Phy or C-Phy interface according to a MIPI standard.

The display 2200 may be implemented as various forms such as Liquid Crystal Display (LCD), Organic Light Emitting Diodes (OLED), Active-Matrix Organic Light-Emitting Diode (AM-OLED), Plasma Display Panel (PDP), Field Emission Display (FED), electronic paper, or the like. In example embodiments, the display 2200 may be used as an input device of the mobile system 2000 by providing a touch screen function. In addition, the display 2200 may be provided integrally with a fingerprint sensor, or the like, to provide a security function of the mobile system 2000. In example embodiments, the AP 2800 may transmit image data to be displayed on the display 2200 to the display 2200 according to a D-Phy or C-Phy interface according to the MIPI standard.

The audio processing unit 2300 may process audio data stored in the flash memory devices 2600a and 2600b or audio data included in a content received from an external device through a model 2400, input/output devices 2700a and 2700b, or the like. For example, the audio processing unit 2300 may perform various processing such as coding/decoding, amplification, noise filtering, and/or the like on audio data.

The modem 2400 may modulate and transmit a signal to transmit/receive wired/wireless data, while recovering an original signal by demodulating a signal received from the outside. The input/output devices 2700a and 2700b are devices providing a digital input/output, and may include a port that can be connected to an external recording medium, an input device such as a touch screen, a mechanical button key, or the like, an output device capable of outputting vibrations through a method such as haptic, and/or the like. In some examples, the input/output devices 2700a and 2700b may be connected to an external recording medium through ports such as USB, a lightning cable, an SD card, a micro SD card, a DVD, a network adapter, or the like.

The AP 2800 may control an overall operation of the mobile system 2000. Specifically, the AP 2800 may control the display 2200 so that a portion of contents stored in the flash memory devices 2600a and 2600b is displayed on a screen. In addition, when a user input is received through the input/output devices 2700a and 2700b, the AP 2800 may perform a control operation corresponding to the user input.

The AP 2800 may be provided as a system-on-chip (SoC) driving an application program, an operating system (OS), and/or the like. In addition, the AP 2800 may also be included in one semiconductor package with other devices included in the mobile system 2000, for example, the DRAM 2500a, the flash memory 2620 and/or the memory controller 2610. For example, at least one device, different from the AP 2800 may be provided in a form of packages such as Package on Package (PoP), Ball grid arrays (BGAs), Chip Scale Packages (CSPs), System In Package (SIP), Multi Chip Package (MCP), Wafer-level Fabricated Package (WFP), Wafer-level processed Stack Package (WSP), or the like. An input/output scheduler or a device driver for controlling the flash memory devices 2600a and 2600b may be included in a kernel of the operating system driven on the AP 2800. The device driver may control an access performance of flash memory devices 2600a and 2600b by referring the number of sync queues managed by an input/output scheduler, or may control a CPU mode inside the SoC, a dynamic voltage and frequency scaling (DVFS), and/or the like.

In example embodiments, the AP 2800 may include a processor block executing an operation, or driving an application program and/or an operating system, and various other peripheral components connected to the processor block through a system bus. Peripheral components may include a memory controller, an internal memory, a power management block, an error detection block, a monitoring block, and/or the like. The processor block may include one or more cores, and when a plurality of cores are included in the processor block, each of the cores may include a cache memory, and a common cache shared by the cores may be included in the processor block.

In example embodiments, the AP 2800 may also include an accelerator block 2820, which is a dedicated circuit for AI data operation. Alternatively, according to example embodiments, a separate accelerator chip may be provided separately from the AP 2800, and a DRAM 2500b may be additionally connected to the accelerator block 2820 or an accelerator chip. The accelerator block 2820 is a function block that specializes in performing a specific function of the AP 2800, and may include a graphs processing unit (GPU), which is a function block that specializes in performing graphic data processing, a neural processing unit (NPU), which is a block that specializes in performing an AI calculation and inference, a data processing unit (DPU), which is a block that specializes in performing data transmission, and/or the like.

According to example embodiments, the mobile system 2000 may include a plurality of DRAMs 2500a and 2500b. In example embodiments, the AP 2800 may include a controller 2810 for controlling the DRAM 2500a and 2500b, and the DRAM 2500a may be directly connected to the AP 2800.

The AP 2800 may control DRAM by setting a command and a mode register set (MRS) conforming to a JEDEC standard, or it is possible to communicate by setting the specifications and functions required by the mobile system 2000 such as low voltage/high speed/reliability, and DRAM interface protocols for CRC/ECC. For example, the AP 2800 may communicate with a DRAM 2500a through an interface conforming to the JEDEC standard such as LPDDR4 LPDDR5, or the like. Alternatively, the AP 2800 may also communicate by setting a new DRAM interface protocol to control a DRAM 2500b for an accelerator in which an accelerator block 2820 or an accelerator chip provided separately from the AP 2800 has a higher bandwidth than the DRAM 2500a.

Although only DRAMs 2500a and 2500b are shown in FIG. 25, a configuration of a mobile system 200 is not necessarily limited to this type, and memories other than the DRAM 2500a and 2500b may be included in the mobile system 2000 according to a bandwidth, a reaction speed, voltage conditions of the AP 2800 or an accelerator block 2820. For example, the controller 2810 and/or the accelerator block 2820 may control various memories such as PRAM, SRAM, MRAM, RRAM, FRAM, hybrid RAM, and/or the like. The DRAMs 2500a and 2500b have relatively lower latency and higher bandwidth than the input/output devices 2700a and 2700b or the flash memory devices 2600a and 2600b. The DRAMs 2500a and 2500b may be initialized when the mobile system 2000 is powered on, and if an operating system and application data are loaded, the DRAMs 2500a and 2500b may be used as a temporary storage location for the application data or an execution space for various software codes.

In the DRAMs 2500a and 2500b, add/subtract/multiply/divide four arithmetic operations, vector operations, address operations, or FFT operation data may be stored. In other example embodiments, the DRAMs 2500a and 2500b may be provided as a processing in memory (PIM) equipped with an arithmetic function. For example, a function for performing an inference used in the DRAM 2500a and 2500b may be performed. Here, the inference may be performed in a deep learning algorithm using an artificial neural network. The deep learning algorithm may include a training step learning a model through various data and an inference step of recognizing data with the trained model. For example, the function used for the inference may include a hyperbolic tangent function, a sigmoid function, a rectified linear unit (ReLU) function, and/or the like.

In some example embodiments, an image captured by a user through the camera 2100 may be signal-processed and stored in the DRAM 2500b, and the accelerator block 2820 or the accelerator chip may perform an AI data operation recognizing by using data stored in the DRAM 2500b and a function used for the inference.

In some example embodiments, the mobile system 2000 may include a plurality of storages or a plurality of flash memory devices 2600a and 2600b having a capacity, greater than that of the DRAMs 2500a and 2500b. The flash memory devices 2600a and 2600b may include a controller 2610 and a flash memory 2620. The controller 2610 may receive a control command data from the AP 2800, and write data to the flash memory 2620 in response to the control command, or read data stored in the flash memory 2620 to be transmitted to the AP 2800.

According to example embodiments, the accelerator block 2820 or the accelerator chip may perform a training step and an AI data operation using the flash memory devices 2600a and 2600b. In an example embodiment, an operation logic capable of executing a predetermined or alternatively, desired operation inside the flash memory devices 2600a and 2600b may be implemented in the controller 2610, and the operation logic may also instead execute at least a portion a training step and an inference AI data operation performed by the AP 2800 and/or the accelerator block 2820 using data stored in the flash memory 2620.

In example embodiments, the AP 2800 may include an interface 2830, and accordingly, the flash memory devices 2600a and 2600b may be directly connected to the AP 2800. For example, the AP 2800 may be implemented as an SoC, the flash memory device 2600a may be implemented as a separate chip different from the AP 2800, and the AP 2800 and the flash memory device 2600a can be mounted in one package. However, example embodiments of the present inventive concepts are not limited thereto, and a plurality of flash memory devices 2600a and 2600b may be electrically connected to the mobile system 2000 through a connection.

The flash memory devices 2600a and 2600b may store data such as still images/movies captured by the camera 2100, or store data received through a communication network and/or a port included in input/output device 2700a and 2700b. For example, the flash memory devices 2600a and 2600b may store Augmented Reality/Virtual Reality, High Definition (HD), or Ultra High Definition (UHD) content.

At least some of devices of the camera 2100, the display 2200, the audio processing unit 2300, the modem 2400, the DRAM 2500a and 2500b, the flash memory devices 2600a and 2600b, the input/output device 2700a and 2700b, and the AP 2800 included in the mobile system 2000 described with reference to FIG. 25 may exchange multi-level signals with each other. For example, the AP 2800 may exchange data with at least one of other components through a multi-level signal. Devices transmitting and receiving signals through a multi-level signal may improve or optimize an operation timing of a multi-level receiver receiving a multi-level signal, by using at least one of the example embodiments described above with reference to FIGS. 1 to 23.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As set forth above, according to example embodiments of the present inventive concepts, a phase of each of clock signals input to a plurality of sense amplifiers receiving a multi-level signal from another external semiconductor device may be individually adjusted. Accordingly, it is possible to improve or optimize the phase of each of the clock signals in consideration of differences in characteristics of each of the sense amplifiers, and to accurately restore information received as a multi-level signal to improve an operation performance of the semiconductor device.

The various and advantageous advantages and effects of the present inventive concepts are not limited to the above description, and can be more easily understood in the course of describing a specific example embodiments of the present inventive concepts.

While example embodiments have been shown and described above, it will be apparent to those skilled in the art that modifications and variations could be made without departing from the scope of the present inventive concepts as defined by the appended claims.

What is claimed is:
1. A semiconductor device, comprising:
a multi-level receiver including N sense amplifiers and a decoder decoding an output of the N sense amplifiers, each of the N sense amplifiers receiving a multi-level signal having M levels and a reference signal (where M is a natural number, higher than 2, and where N is a natural number, lower than M);

a clock buffer configured to receive a reference clock signal; and a clock controller configured to,
- generate N clock signals using the reference clock signal, input the N clock signals to the N sense amplifiers, respectively,
- individually determine a phase of each of the N clock signals using the output of the N sense amplifiers,
- determine a first threshold delay time for each of the N clock signals by increasing a delay time of each of the N clock signals, and
- determine a second threshold delay time for each of the N clock signals by decreasing the delay time of each of the N clock signals,
- wherein for each of the N clock signals, a phase is determined based on the first threshold delay time and the second threshold delay time.

2. The semiconductor device of claim 1, wherein the N sense amplifiers comprise a first sense amplifier and a second sense amplifier, and the first sense amplifier receives a first reference signal, and the second sense amplifier receives a second reference signal, different from the first reference signal, and
the N clock signals comprise a first clock signal input to the first sense amplifier and a second clock signal input to the second sense amplifier, a phase of the first clock signal is different from a phase of the second clock signal.

3. The semiconductor device of claim 1, wherein when the multi-level receiver receives a test data pattern from an external controller as the multi-level signal, the clock controller determines a phase for each of the N clock signals.

4. The semiconductor device of claim 3, wherein the clock controller increases the delay time of each of the N clock signals, compares output data of the N sense amplifiers with the test data pattern, and determine a delay time when the output data is different from the test data pattern as the first threshold delay time.

5. The semiconductor device of claim 3, wherein the clock controller decreases the delay time of each of the N clock signals, compares output data of the N sense amplifiers with the test data pattern, and determines a delay time when the output data is different from the test data pattern as the second threshold delay time.

6. The semiconductor device of claim 1, wherein the first threshold delay time has a positive sign and the second threshold delay time has a negative sign, and
the delay time is determined from a sum of the first threshold delay time and the second threshold delay time.

7. The semiconductor device of claim 1, wherein M is a power of 2, and N is equal to M−1.

8. The semiconductor device of claim 1, wherein a reference signal input to each of the N sense amplifiers has a level, different from the M levels.

9. The semiconductor device of claim 1, wherein the clock controller sequentially determines the phase of each of the N clock signals.

10. A semiconductor device, comprising:
a memory cell array including a plurality of memory cells connected to a plurality of word lines and a plurality of bit lines;
a word line driver connected to the word lines;
a read/write circuit connected to the bit lines;
a multi-level receiver including a plurality of sense amplifiers receiving a multi-level signal having M levels (where M is a natural number, higher than 2) from an external controller, and a decoder decoding an output of the sense amplifiers; and
a clock controller configured to generate a plurality of clock signals and input the clock signals to the plurality of sense amplifiers, respectively, and individually adjust a phase of each of the clock signals using the output of the plurality of sense amplifiers, when the multi-level receiver receives a test data pattern from the external controller during a refresh operation on the memory cells.

11. The semiconductor device of claim 10, wherein the multi-level receiver receives a pseudo random binary sequence (PRBS) pattern as the test data pattern, during the refresh operation.

12. The semiconductor device of claim 10, wherein the multi-level signal is at least one of a data (DQ) signal, a data strobe (DQS) signal, and a command/address (CA) signal.

13. The semiconductor device of claim 10, wherein each of the plurality of sense amplifiers comprises a plurality of unit sense amplifiers,
each of the clock signals comprises a plurality of sub-clock signals having different phases, and
each of the plurality of unit sense amplifiers receive the sub-clock signals, respectively.

14. The semiconductor device of claim 13, wherein each of the clock signals comprises a first sub-clock signal, and two to fourth sub-clock signals phase-shifted by 90 degrees, 180 degrees, and 270 degrees from the first sub-clock signal.

15. The semiconductor device of claim 10, wherein the clock controller determines a first threshold delay time for each of the clock signals by increasing a delay time of each of the clock signals until an output of the plurality of sense amplifiers is different from the test data pattern, determines a second threshold delay time for each of the clock signals by decreasing the delay time of each of the clock signals until the output of the plurality of sense amplifiers is different from the test data pattern, and
for each of the clock signals, a phase is determined based on the first threshold delay time and the second threshold delay time.

16. The semiconductor device of claim 15, wherein at least a portion of the clock signals has different phases.

17. A memory system, comprising:
a memory device having a plurality of memory cells; and
a controller connected to the memory device through a plurality of pins, and configured to control the memory device,
wherein the controller transmits at least one of a data signal, a data strobe signal, and a command/address signal through the plurality of pins to the memory device,
the controller transmits a refresh command to the memory device, and
while the memory device performs a refresh operation in response to the refresh command, the controller transmits a test data pattern to the memory device as a multi-level signal through at least one of the plurality of pins.

18. The memory system of claim 17, wherein the memory device receives the test data pattern through a pin receiving at least one of the data signal, the data strobe signal, and the command/address signal, among the plurality of pins.

19. The memory system of claim 18, wherein the memory device receives at least one of the data signal, the data strobe signal, and the command/address signal as the multi-level signal after the refresh operation, through the pin receiving the test data pattern during the refresh operation.

* * * * *